US012644915B2

(12) United States Patent
Dorrough et al.

(10) Patent No.: US 12,644,915 B2
(45) Date of Patent: **\*Jun. 2, 2026**

(54) APPARATUS, METHODS, AND TECHNIQUES OF DISPLAY FOR OBSCURED FEATURE DETECTION WITH LIVE WIRE DETECTION

(71) Applicant: Franklin Sensors Inc., Meridian, ID (US)

(72) Inventors: David M. Dorrough, Eagle, ID (US); Daniel S. Toborg, Meridian, ID (US); Natalie A. Boehm, Meridian, ID (US); Jay R. Paxman, Meridian, ID (US)

(73) Assignee: Franklin Sensors Inc., Meridian, ID (US)

( \* ) Notice: Subject to any disclaimer, the term of this patent is extended or adjusted under 35 U.S.C. 154(b) by 124 days.

This patent is subject to a terminal disclaimer.

(21) Appl. No.: 18/585,502

(22) Filed: Feb. 23, 2024

(65) Prior Publication Data

US 2024/0230740 A1 Jul. 11, 2024

Related U.S. Application Data

(63) Continuation-in-part of application No. 17/831,247, filed on Jun. 2, 2022, now Pat. No. 11,921,143.

(51) Int. Cl.
_G01R 29/12_ (2006.01)
(52) U.S. Cl.
CPC ................................... _G01R 29/12_ (2013.01)
(58) Field of Classification Search
CPC ................................................ G01R 29/0892

USPC ........................................................ 324/457
See application file for complete search history.

(56) References Cited

U.S. PATENT DOCUMENTS

| | | | | |
|---|---|---|---|---|
| 4,388,589 A | * | 6/1983 | Molldrem, Jr. ...... | G01R 13/404 |
| | | | | 340/815.45 |
| 4,464,622 A | * | 8/1984 | Franklin ................ | G01V 3/088 |
| | | | | 324/67 |
| 4,825,150 A | * | 4/1989 | Sirasud .................. | G01R 31/54 |
| | | | | 324/133 |
| 5,119,019 A | * | 6/1992 | George .................. | G01R 15/08 |
| | | | | 702/65 |
| 5,122,733 A | * | 6/1992 | Havel .................. | G01R 13/405 |
| | | | | 345/83 |

(Continued)

OTHER PUBLICATIONS

"Customer Reviews for Zircon SuperScan M4 Stud Finder", https://www.homedepot.com/p/reviews/Zircon-SuperScan-M4-Stud-Finder-71438/315382839/3, Jan. 2021.

(Continued)

_Primary Examiner_ — Christopher P Mcandrew
(74) _Attorney, Agent, or Firm_ — Foley & Lardner LLP

(57) ABSTRACT

Obscured feature detectors are disclosed that have both the capability to sense the location of obscured structural features and the ability to warn a user of obscured live electrical wires in the vicinity. Apparatus, devices, and methods to detect a presence of hidden or obscured objects or features behind opaque, solid surfaces are disclosed. Beams, studs and columns behind walls and joists beneath floors can be located. Also, a presence of an electrical field strength associated with live wires behind walls and beneath floors can be detected. The location of obscured features and the electric field strength can be displayed simultaneously.

19 Claims, 13 Drawing Sheets

(56) References Cited

U.S. PATENT DOCUMENTS

| | | | | |
|---|---|---|---|---|
| 5,477,133 | A * | 12/1995 | Earle ..................... | G01R 31/54 |
| | | | | 340/407.1 |
| 6,211,662 | B1 | 4/2001 | Bijawat et al. | |
| 7,013,570 | B2 * | 3/2006 | Levine .................... | G01V 3/15 |
| | | | | 324/67 |
| 7,102,366 | B2 * | 9/2006 | Denen ................ | A47K 10/3687 |
| | | | | 324/662 |
| 7,495,455 | B2 * | 2/2009 | Sanoner .............. | G01R 29/085 |
| | | | | 324/67 |
| 7,642,730 | B2 * | 1/2010 | Dowling ............. | H05B 47/165 |
| | | | | 362/372 |
| 8,274,273 | B2 * | 9/2012 | Nguyen ............. | H01M 10/488 |
| | | | | 324/126 |
| 8,593,163 | B2 * | 11/2013 | Dorrough ............. | G01V 3/088 |
| | | | | 324/67 |
| 8,669,772 | B2 * | 3/2014 | Dorrough ............. | G01R 27/26 |
| | | | | 324/67 |
| 9,664,808 | B2 * | 5/2017 | Nguyen ............. | H01M 10/052 |
| 10,209,357 | B2 * | 2/2019 | Rhead ....................... | G01S 7/24 |
| 10,564,116 | B2 * | 2/2020 | Rhead ....................... | G01V 3/08 |
| 10,571,423 | B2 * | 2/2020 | Eidinger ................... | G01V 3/15 |
| 10,571,591 | B2 * | 2/2020 | Rhead ..................... | G01V 3/08 |
| 10,585,203 | B2 * | 3/2020 | Rhead .................... | G01N 27/00 |
| 2011/0215819 | A1 | 9/2011 | Dorrough | |

OTHER PUBLICATIONS

Zircon, "SuperScan M4", https://www.zircon.com/wp-content/
uploads/2020/11/71532C-SSM4- Inst_LR.pdf, Nov. 2020.

* cited by examiner

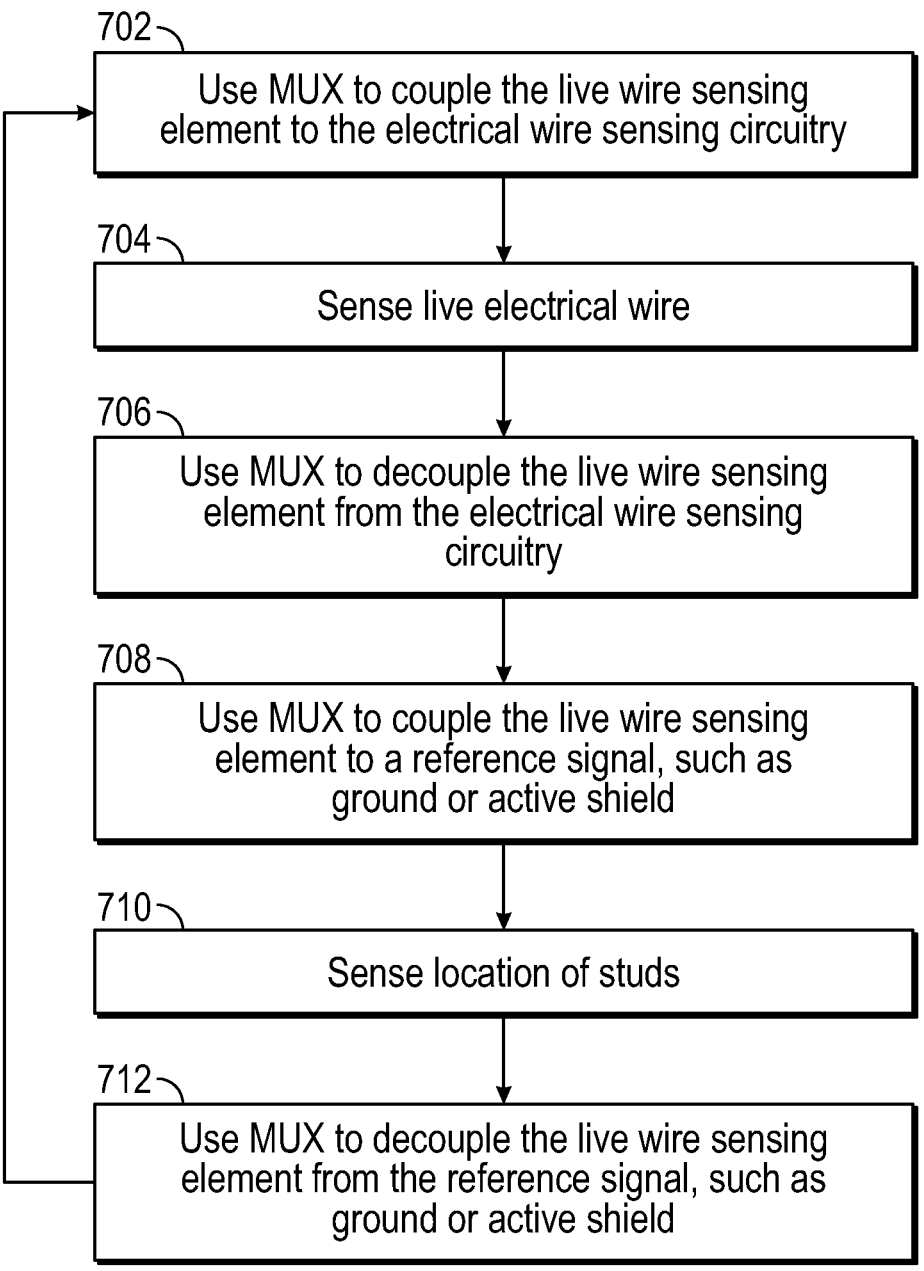

702 — Use MUX to couple the live wire sensing element to the electrical wire sensing circuitry 704 — Sense live electrical wire 706 — Use MUX to decouple the live wire sensing element from the electrical wire sensing circuitry 708 — Use MUX to couple the live wire sensing element to a reference signal, such as ground or active shield 710 — Sense location of studs 712 — Use MUX to decouple the live wire sensing element from the reference signal, such as ground or active shield

FIG. 7

1002 — Drive live wire sensing element to float

1004 — Sense live electrical wire

1006 — Drive live wire sensing element to a reference, such as ground

1008 — Sense location of studs

APPARATUS, METHODS, AND TECHNIQUES OF DISPLAY FOR OBSCURED FEATURE DETECTION WITH LIVE WIRE DETECTION

RELATED APPLICATIONS

This application is a continuation-in-part of U.S. patent application Ser. No. 17/831,247, filed on Jun. 2, 2022, the disclosure of which is hereby incorporated herein by reference in its entirety.

TECHNICAL FIELD

The present disclosure relates to obscured feature detectors that have both the capability to sense the location of obscured features (e.g., behind walls and beneath floors) and the ability to warn the user if live electrical wires are in the vicinity.

BACKGROUND

Locating obscured features such as beams, studs, joists, and other elements behind walls and beneath floors is a common problem encountered during construction, repair, and home improvement activities. Cutting or drilling into a wall, floor, or other supported surface to create an opening in the surface, while avoiding the underlying support elements, is a regular occurrence. Knowing where the support elements are positioned before beginning can be desirable so as to avoid cutting or drilling into the support elements. Anchoring a heavy object such as a picture, cabinet, or shelf to a support element obscured by a supported surface is also a common occurrence. In these cases, it is often desirable to install a fastener through the supported surface in alignment with an underlying support element. However, with the wall, floor or supported surface in place, the location of the support element is not visually detectable.

Obscured feature detectors with electronic sensors have also been developed to detect obscured features behind opaque surfaces. These detectors sense changes in capacitance on the examined surface that result from the presence of features positioned behind, beneath or within the surface. These changes in capacitance are detectable through a variety of surfaces such as wood, sheetrock, plaster, and gypsum and do not rely on the presence of metal fasteners in the surface or obscured feature for activation of the sensor.

Simply detecting obscured structural features has limitations. Electrical wires can also be obscured behind an opaque surface. The electrical wires may not be near a support structure and regardless of location it may be desirable to avoid electrical wires, particularly if the wires are live.

Presently available obscured feature detectors with dual sensing capability exist to detect both obscured features and live electrical wires. The presently available obscured feature detectors use a live wire sensing element that is left electrically floating and is sensed. As a result, the live wire sensing element's voltage level oscillates in the presence of live electrical wire, though at a substantially lower voltage. An amplifier may be used to increase the signal strength of the sensed live wire sensing element. Further, these presently available obscured feature detectors continually sense the live wire sensing element and an algorithm facilitates determining whether to activate a warning signal to the user to warn that a live wire may be in vicinity. While the live wire sensing element is sensing (e.g., detecting an electrical field formed between the live wire sensing element and a live electrical wire), a separate set of circuitry and a separate set of sensor pads sense for the presence of obscured features (e.g., sense for electrical field formed between the obscured feature sensing pads and ground or reference). As a result, there is one set of circuitry for sensing of the live wires, and a separate set for sensing for the obscured features. Multiple sources of electrical fields may interfere with accurate obscured feature sensing. Stated differently, these presently available obscured feature detectors include distinct modes and mechanisms of sensing live electrical wires and sensing other obscured features, albeit packaged in a single product.

SUMMARY

The present disclosure is directed to apparatus, methods, and generally to devices to detect a presence of hidden or obscured objects or features behind opaque, solid surfaces, and more specifically to devices to locate beams, studs and columns behind walls and joists beneath floors and also to detect a presence of the electrical field strength associated with live electrical wires behind walls and beneath floors, and to display the location of obscured features and display the electric field strength simultaneously.

Additional aspects and advantages will be apparent from the following detailed description of preferred embodiments, which proceeds with reference to the accompanying drawings.

BRIEF DESCRIPTION OF THE DRAWINGS

FIG. 7 is a flowchart that illustrates a flow of the sensing operation, according to one embodiment of the present disclosure.

DETAILED DESCRIPTION OF PREFERRED EMBODIMENTS

Figures 1A, 1B, 1C, 1D, 1E:
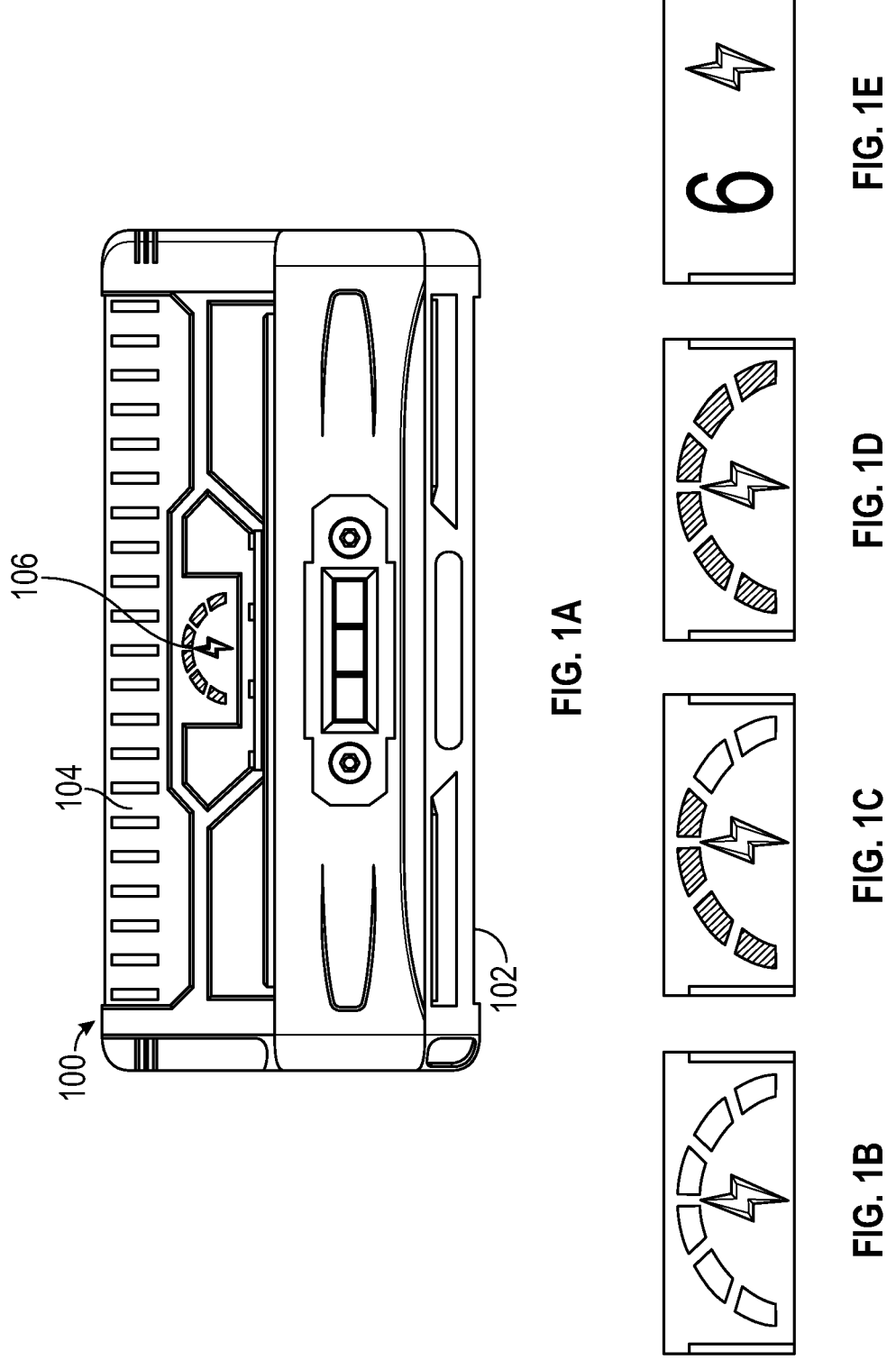
FIG. 1A is a top view of an obscured feature detector, according to one embodiment of the present disclosure.
FIG. 1B shows a live wire indicator that displays to the user a variable electrical field strength of a detected live electrical wire.
FIG. 1C shows a live wire indicator that displays to the user a variable electrical field strength of a detected live electrical wire.
FIG. 1D shows a live wire indicator that displays to the user a variable electrical field strength of a detected live electrical wire.
FIG. 1E shows a live wire indicator that displays a number on a numerical scale to display the variable electrical field strength of the detected live electrical wire.

The present disclosure relates generally to devices to detect a presence of hidden or obscured objects or features behind opaque, solid surfaces, and more specifically to devices to locate beams, studs and columns behind walls and joists beneath floors and also to locate electrical wires behind walls and beneath floors.

Obscured feature detectors with dual sensing capability exist. These presently available dual-sensing obscured feature detectors use a live wire sensing element that is left electrically floating, and is sensed. As a result, a voltage level of the live wire sensing element oscillates in the presence of live electrical wire. For example, in the United States house wiring is commonly 120V, 60 Hz. Therefore, if the floating live wire sensing element is in the presence of a live electrical wire, it will also oscillate at 60 Hz. However, it will oscillate with a voltage that will likely be substantially less than 120V. These presently available obscured feature detectors commonly apply an amplifier to increase the signal strength of the sensed live wire sensing element. The prior art obscured feature detectors continually sense the live wire sensing element. An algorithm may then determine whether to activate a warning signal to the user to warn that a live wire may be within a near vicinity. Concurrent with the live wire sensing element being sensed, a separate set of circuitry and separate set of sensor pads sense for the presence of obscured features. As a result, there is one set of circuitry for sensing of the live wires, and a separate set for sensing of the obscured features. This form of separate yet dual sensing has been commonly used in presently available obscured feature products.

A shortcoming of the prior art obscured feature detectors (sometimes also known as stud finders) is that the live wire sensing element can interfere with the sensing of obscured features. As the floating live wire sensing element oscillates it can interfere with the sensing of obscured features. Electrical fields formed by a live electrical wire and the floating live wire sensing element may impair accurate sensing of electrical fields generated for detection of obscured features. This problem becomes more pronounced with higher accuracy obscured feature detectors that have more sensor pads.

An embodiment of the present disclosure achieves higher accuracy obscured feature sensing and maintains the capability to warn the user if a live wire is present. It achieves higher accuracy sensing of obscured features, and at a very low cost.

The presently disclosed embodiments may achieve this result by interleaving the sensing of obscured features and live wires. For example, a multiplexer (MUX) may be used to couple a live wire sensing element to either sensing circuitry, or to a reference such as ground or an active shield. This interleaving can allow the live wire sensing element to float, while being sensed. The sensed signal may be amplified, such as by an op-amp, to make the signal more useable for communicating information to the user. For example, the amplified signal may be fed into an analog to digital converter (ADC). In some embodiments the ADC may be built into a microcontroller. In some embodiments it may be advantageous to only sense for about 2 cycles of the 60 Hz signal, which equates to about 33 milliseconds. By limiting the sensing time, it may be possible to make an obscured feature detector that is more responsive. Two cycles may be enough in some embodiments to identify that the signal is a 50 Hz or 60 Hz signal. In some embodiments the readings of the ADC will be recorded first, then processed second. In some embodiments, 100 samples taken over a period of about 33 milliseconds may be sufficient.

In some embodiments it may be advantageous to process the reading to determine if the reading comes primarily from a 50 Hz or 60 Hz source. If the signal seems to have a frequency that is approximately 50 Hz or 60 Hz it would indicate that it likely came from a live wire, rather than from a spurious source, and make it possible to more accurately predict if the readings came from a live wire. Therefore, in some embodiments it may be advantageous to employ digital filtering techniques to determine if the reading is primarily from a 50 Hz or 60 Hz source. There are many known techniques that can accomplish this that may be employed by those skilled in the art. Some of the techniques may include pattern matching the readings against predetermined wave shapes, or using digital low-pass and high pass filters to create band-pass filters to remove all but the 50 Hz or 60 Hz component, or other techniques.

After the live wire sensing is complete, the MUX may be switched to couple the live wire sensing element to a reference signal such as ground, or to active shield, or to another known reference signal.

Once the MUX couples the live wire sensing element to a known reference, then the sensing of the obscured features may take place. In some embodiments, digital processing of previously stored readings from the live wire sensing may take place simultaneously or otherwise concurrently with the sensing of obscured features. Likewise digital processing of the obscured feature detector readings may take place during the live wire sensing.

The obscured feature detector may include a sensing element with one or more sensing pads. When the sensing element is positioned on a surface at a location with no obscured feature behind the surface, the obscured feature detector measures the capacitance of the surface and the air behind the surface. When the sensing element is moved into a position having an obscured feature behind the surface, the apparatus 100 then measures the capacitance of the surface and the obscured feature, which has a higher dielectric constant than air. Accordingly, the obscured feature detector registers an increase in capacitance, which can then be used to trigger a feedback system, such as a proximity indicator display, to alert the user that an obscured feature has been detected behind the surface.

Additional background on sensing obscured features, may be obtained with reference to the following U.S. Pat. Nos. 8,476,912, 8,593,163, 8,669,772, 8,736,283, 8,791,708, 8,836,347, 8,884,633, 10,261,208, 10,613,243, 10,663,613, which may include additional information pertinent to the obscured feature detection disclosed herein.

Once the sensing of the obscured features is complete, then the MUX may be switched back such that the electrical wire sensing circuitry is once again coupled to the live wire sensing element.

Other functions and features can also be included in the disclosed obscured feature detector embodiments. For example, enhancements to the display can be included and the display can be updated to let the user know what has been sensed. The display may be updated between any step, or possibly between every step, and in some embodiments updating the display may only happen after a predetermined number of cycles has completed.

When obscured features are being detected, the live wire sensing element is coupled to a reference. In some embodiments the reference may be ground. In some embodiments the reference may be an active shield. In other embodiments it may be coupled to a different reference signal. It some embodiments it may be advantageous to make the reference be similar to the surroundings of the live wire sensing element. For example, if the live wire sensing element is surrounded by ground, it may be advantageous to make the reference ground. Likewise, if the live wire sensing element is surrounded by active shield it may be advantageous to make the reference to active shield. In some embodiments this will allow all of the sensor pads to have a more similar response and increase the ability to sense obscured features accurately.

A handheld apparatus for detection of obscured features and obscured live wires is used by scanning along a surface, such as a wall, with the apparatus which will provide feedback to a user in real time, typically by an audible or visible alarm, when an obscured feature or live wire is detected in the vicinity. The obscured feature detected by such devices may be an obstruction, like wood or metal studs, and can aid the user to determine a location to safely drill, nail, screw, dig, or the like.

FIG. 1A is a top view of an apparatus 100 for detection of obscured features and obscured live electrical wires, according to one embodiment. The apparatus 100 comprises a housing 102 that houses or otherwise supports indicator displays to visually alert a user when an obscured feature or live wire is detected. The housing 102 also includes sensing elements to sense location of an obscured feature or live electrical wire. The housing 102 may be in a shape, such as a rectangular shape, to support obscured feature sensing elements arranged in a linear configuration on a circuit board of the apparatus for scanning an obscured surface. The apparatus 100 may include one or more types of indicators such as, for example, a proximity indicator display 104 to alert a user that an obscured feature is in the vicinity and a live wire indicator display 106 to alert the user that live wires are sensed nearby. The live wire indicator display 106 is configured to display (e.g., to a user) visual indicia of a variable electrical field strength of a detected live electrical wire. The visual indicia may be varied or changed to display the variability of the electrical field strength of the detected live electrical wire.

In some embodiments, the proximity indicator display 104 may include a visual indicator such as one or more illuminating elements (e.g., light, light emitting diode (LED)). A proximity indicator display 104 may include a plurality of visual indicators arranged in an array. One or more of the visual indicators (of the plurality of visual indicators) may be activated to indicate detection of an obscured feature. In some embodiments, a sensing element may include a plurality of pads, as will be described in greater detail below, and visual indicator may correspond to a sensor pad, such that a measured reading on a sensor pad that indicates detection of an obscured feature results in activation of one or more corresponding visual indicators of the proximity indicator display. In some embodiments, a proximity indicator may include an alarm or other audio device to provide an audible alert to a user. In FIG. 1A, the apparatus 100 includes a proximity indicator display 104 that includes an array of LEDs extending along a length of the apparatus 100. As an obscured feature is detected, one or more of the LEDs is activated to indicate a location of the obscured feature along a length of the apparatus 100, providing clarity as to a location of where the obscured feature is positioned and where the obscured feature is not.

As shown in the illustrated embodiment, the live wire indicator display 106 may include one or more visual indicators, such as one or more illuminating elements (e.g., a light, LED). In some embodiments, a live wire indicator may include an alarm or other audio device to provide an audible alert to a user.

FIG. 1B-1D illustrate the live wire indicator display 106 that includes a plurality of illuminating elements 107 to incrementally display the variable electrical field strength of an obscured live electrical wire (e.g., detected live electrical wire). As discussed below, live wire sensing elements detect the variable electrical field strength of the detected live electrical wire. The detected electrical field strength of the detected live electrical wire is variable because the strength is dependent on how close the live wire sensing elements are to the obscured live electrical wire. In other words, if the live wire sensing elements are close to the obscured live electrical wire, the electrical field strength is stronger than if the live wire sensing elements are further away form the obscured live electrical wire.

In the illustrated embodiment, the live wire indicator display 106 includes six illuminating elements 107. However, the current disclosure is not so limited, and the live wire indicator display 106 may include more or less than six illuminating elements 107. The number of illuminating elements 107 that are illuminated corresponds to the electrical field strength of the detected live electrical wire.

For example, FIG. 1B illustrates zero of the six illuminating elements 107 illuminated signifying that the live wire sensing elements do not detect a live electrical wire. FIG. 1C illustrates four of the six illuminating elements 107 illuminated signifying that the live wire sensing elements detected a live electrical wire and is relatively close to the location of the live electrical wire. FIG. 1D illustrate all six of the illuminating elements 107 illuminated signifying that the live wire sensing elements detected a live electrical wire and is close to the location of the live electrical wire. In other words, the electrical field strength of the live electrical wire increases the closer the live wire sensing elements are to the live electrical wire. The number of illuminating elements 107 illuminate incrementally to show the increase in the detected electrical field strength of the detected live electrical wire. Therefore, a larger number of illuminated illuminating elements indicates a stronger electrical field strength of the detected live electrical wire than a smaller number of illuminated illuminating elements.

In some embodiments, the live wire indicator displays a number on a numerical scale to display the variable electrical field strength of the detected live electrical wire. For example, FIG. 1E illustrates a live wire indicator displaying the number six on a numerical scale of 0-10, which corresponds to the detected electrical field strength of the detected live electrical wire. Zero corresponds to the live wire sensing elements not detecting a live electrical wire and ten corresponds to the live wire sensing elements detecting a live electrical wire close to the live electrical wire. Other numerical scales may be used other than 0-10.

Figure 2:
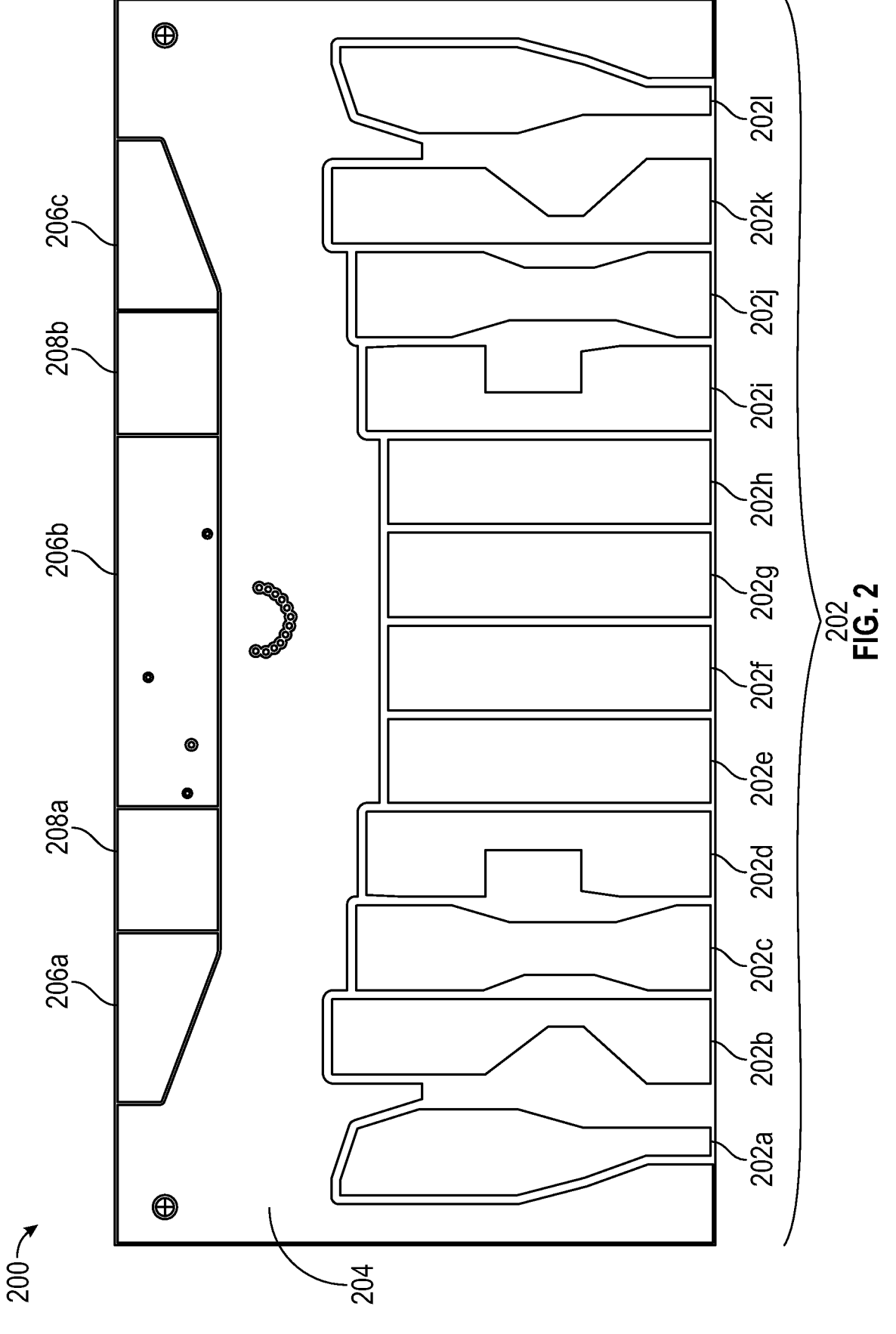
FIG. 2 is a diagram of a bottom layer of a circuit board of an obscured feature detector, according to one embodiment of the present disclosure.

FIG. 2 is a diagram of a bottom layer of a circuit board 200 in an apparatus for detection of obscured features and obscured live electrical wires, according to one embodiment of the present disclosure. The circuit board 200 can be included in the apparatus 100 of FIG. 1A. The circuit board 200 includes an obscured feature sensing element 202 that comprises a plurality of sensing pads 202*a*-202*l* that are used to sense presence of an obscured feature in the vicinity when scanning a surface. The obscured feature sensing element 202 performs a sensor reading of a surface to detect obscured features. The sensing element 202, collects sensor readings from each sensing pad 202*a*-202*l*, compares the readings, and the one or more sensing pads with the highest readings are interpreted to be near the location of an obscured feature. When the obscured feature sensing pads 202*a*-202*l* are placed on a surface at a location with no obscured feature behind the surface, the apparatus 100 measures the capacitance of the surface and the air behind the surface. When the sensing pads 202*a*-202*l* are moved into a position having an obscured feature behind the surface, the apparatus 100 then measures the capacitance of the surface and the obscured feature, which has a higher dielectric constant than air. Consequently, the apparatus 100 registers an increase in capacitance, which can then be used to trigger a feedback system, such as a proximity indicator display (e.g., the display 104 of FIG. 1A), to alert the user that an obscured feature has been detected behind the surface.

The obscured feature sensing element 202 is configured to form a first end of an electric field and to take a sensor reading of the electric field, in which the electric field varies based on proximity of the sensor element to surrounding objects and on material property of each of the surrounding objects. In FIG. 2, the obscured feature sensing element 202 includes a plurality of sensing pads 202*a*-202*l* arranged linearly. Each of the sensing pads 202*a*-202*l* are configured to form a first end of a respective corresponding electric field and to take a sensor reading of the corresponding electric field. The sensing pads 202*a*-202*l* may have a rectangular shape, a symmetric shape, an asymmetric shape, an irregular shape, or another complex-geometry shape, to produce a uniform sensor field among a group of sensor pads. The shapes may be formed so that a similar signal response in each sensor pad is produced. The circuit board 200 includes a common plate 204 to form a second end of the corresponding electric field of the obscured feature sensing element. The common plate 204 may be an active shield plate which may be driven as an active shield. The active shield may be driven by the same signal as sensing pads 202*a*-202*l*. The bottom layer of circuit board 200 also include ground plates 206*a*-206*c*. The ground plates 206*a*-206*c* may be connected to the circuit ground.

For detection of live electrical wires, the bottom layer of circuit board 200 further includes live wire sensing elements 208*a* and 208*b* for detection of live wires in the vicinity. Live wire sensing elements 208*a* and 208*b* may be either coupled to a reference such as the ground plates 206*a*, 206*b*, 206*c* or the active shield 204 when the apparatus is detecting obscured features, or the live wire sensing elements 208*a* and 208*b* may be left floating to detect the presence of live electrical wires. The live wire sensing elements 208*a* and 208*b* can be positioned adjacent to and between a plurality of ground plates 206*a*, 206*b*, 206*c*. The mechanism of how live wires are detected is explained later in this disclosure.

Figure 3:
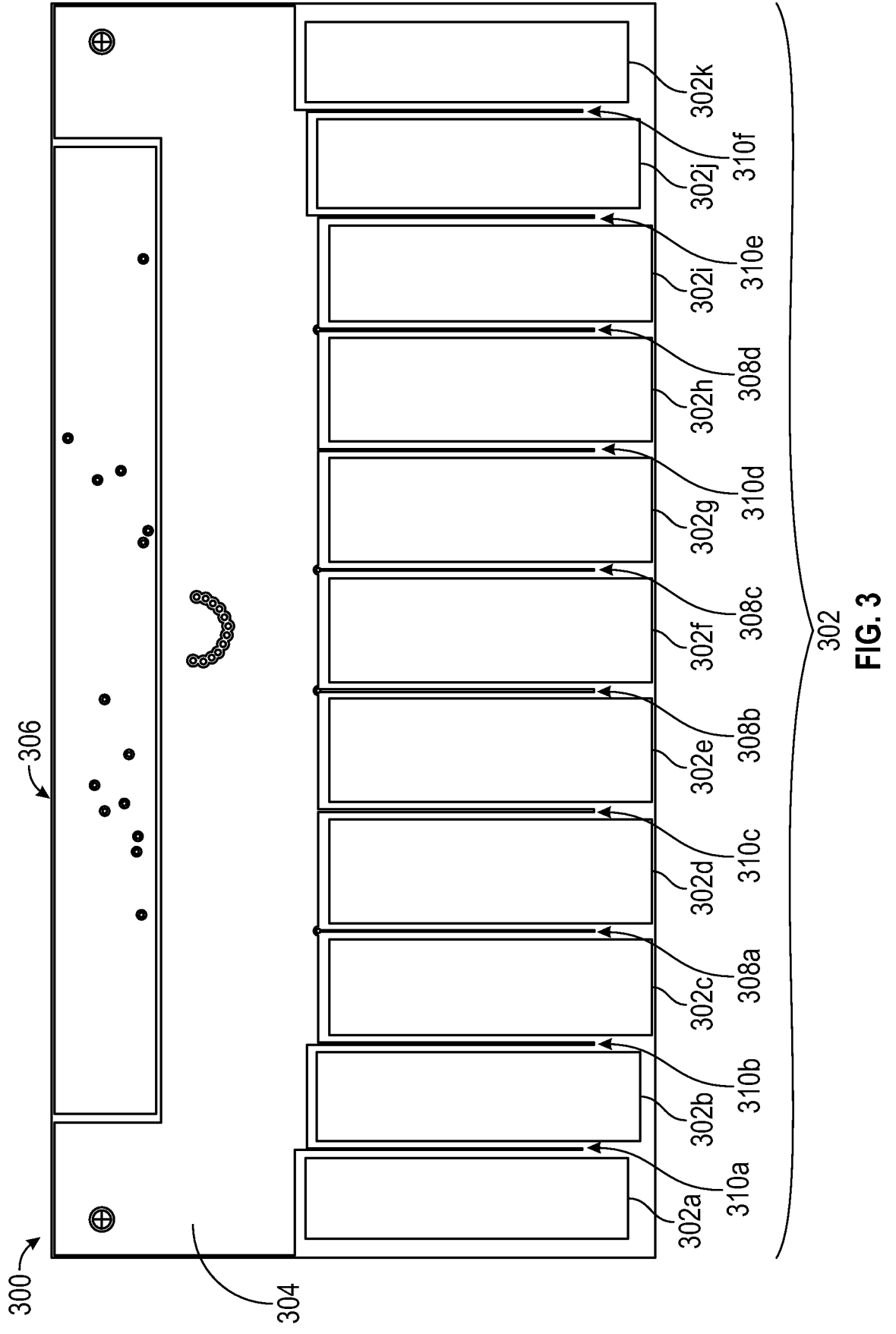
FIG. 3 shows the bottom layer of a circuit board of an obscured feature detector, according to another embodiment of the present disclosure.

FIG. 3 is a diagram of a bottom layer of circuit board 300, according to an embodiment of the present disclosure. The circuit board 300 may be integrated or otherwise included in an apparatus, such as the apparatus 100 of FIG. 2, which detects obscured features and obscured live wires. The circuit board 300 includes an obscured feature sensing element 302, a common plate 304 which is an active shield plate driven as active shield, and a single ground plate 306 which may be connected to circuit ground. The obscured feature sensing element 302 comprises a plurality of sensing pads 302*a*-302*k* that are used to sense presence of an obscured feature in the vicinity when scanning a surface. The sensing pads 302*a*-302*k* can be uniformly rectangular and primarily arranged in a generally linear fashion, and those pads 302*a*, 302*b*, 302*j*, 302*k* at the peripheral ends may be slightly adjusted to enhance uniformity of sensing at the peripheral ends. The sensing pads 302*a*-302*k* each perform a reading of a surface, then the readings are compared to recognize or otherwise identify which of the sensing pads 302*a*-302*k* sensed the highest reading(s) of the surface because the highest reading(s) may indicate a detection of an obscured feature. Sensing pads 302*a*, 302*b*, 302*j*, 302*k* that are positioned near the ends in an array of sensing pads 302 may respond to obscured features in a different manner, such as by responding with a disproportionately higher reading (due to producing electric fields that extend beyond the array of the sensing pads 302) when compared to responses of those located near the center of the array of sensing pads 302. This issue may be particularly evident in a linearly-arranged group of sensing pads when the obscured feature detector is moved from a thinner or less dense surface to a thicker or more dense surface. The sensing pads of the sensing element 302 that are positioned near the peripheral ends, for example sensing pads 302*a*, 302*b*, 302*j*, and 302*k*, are positioned in a way that the sensing pads 302*a*-302*k* form an arcuate pattern on the circuit board 300 as shown in FIG. 3. The circuit board 300 also includes active shield rods 310*a* and 310*b* positioned between the plurality of sensing pads 302*a*-302*k* of the sensing element 302. The active shield rods 310*a*-310*f* are electrically connected to the common plate 304 and may provide increased parallelism such that the sensing element 302 produces a more uniform response when detecting presence of an obscured feature, thereby increasing the ability of the apparatus 100 to sense obscured features.

For detecting obscured live wires behind a surface, the circuit board 300 further includes a wire sensing element comprising one or more wire sensing wires 308*a*-308*d* (collectively considered "wire sensing element 308"). Each of these one or more wires 308*a*-308*d*, when left floating, can be used for detection of live wires nearby. The wire sensing element 308 is coupled to a reference, such as the common plate 304 or the ground plate 306, when the apparatus is detecting obscured features instead of live wires. Each of the one or more wires 308*a*-308*d* of the wire sensing element 308 is located between the plurality of sensing pads 302*a*-302*k*.

Figure 4:
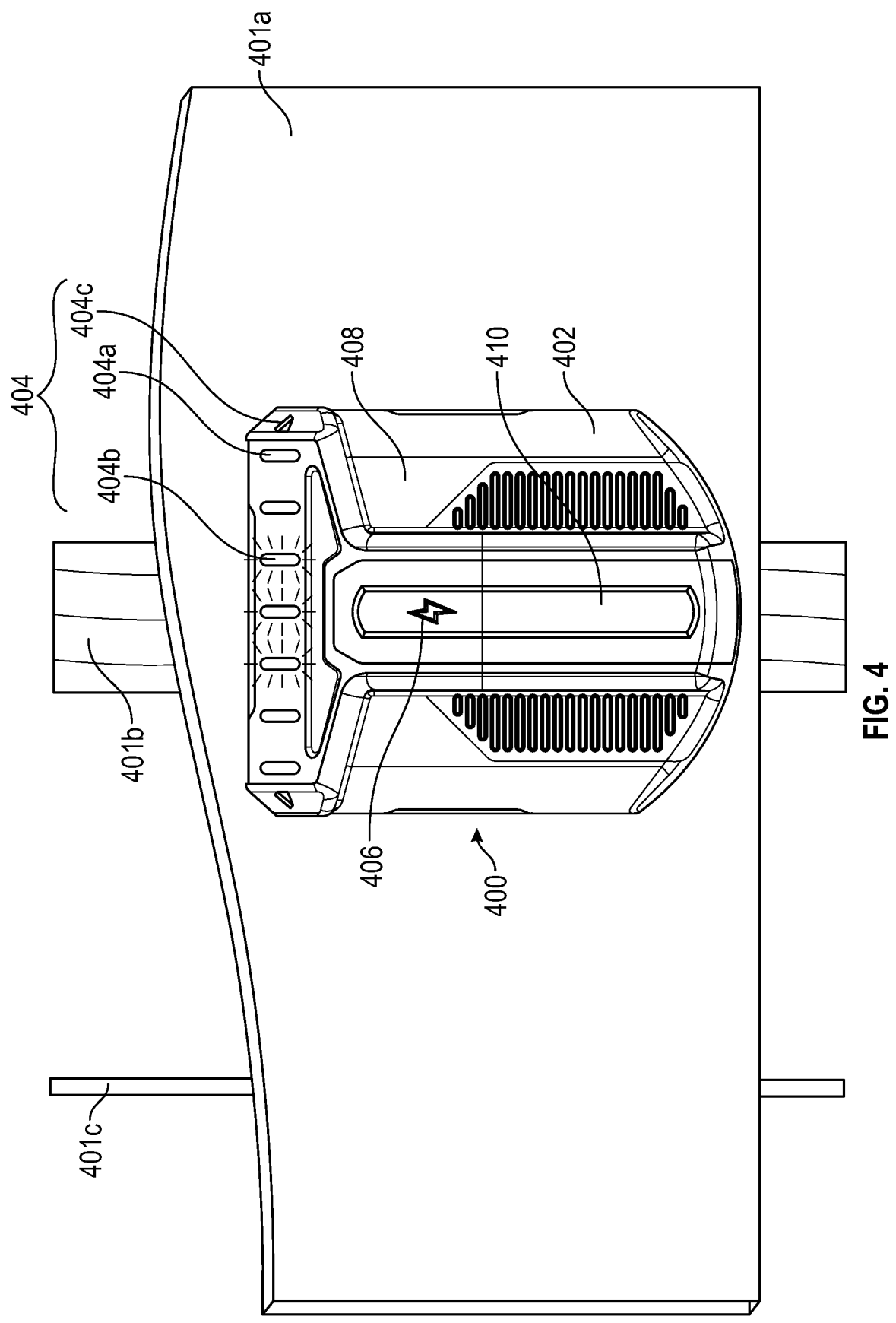
FIG. 4 illustrates an obscured feature detector, according to another embodiment of the present disclosure.

FIG. 4 is a top view of an obscured feature and live wire detection apparatus 400, according to another embodiment of the disclosure. Similar to the apparatus 100 of FIG. 1A, the apparatus 400 of FIG. 4 is used by scanning an opaque surface 401*a*, such as sheetrock, to sense and detect an obscured feature 401*b* and/or live wire 401*c*. The apparatus 400 includes a housing 402 that can house or otherwise support an indicator display 404 that can visually alert a user when the apparatus 400 detects an obscured feature or live wire. The indicator display 404 can indicate to a user the position of the obscured feature by displaying an inactive state 404a where an obscured feature is not sensed and by displaying an active state 404b where an obscured feature is detected. This feature may also be applicable to the illustrated embodiment of FIG. 1A. The indicator display 404 also includes a proximity indicator 404c that alerts the user when an obscured feature is sensed in the vicinity. The indicator display 404 can also include a live wire indicator 406 to alert the user when a live wire is sensed. In some embodiments, the live wire indicator 406 may display a variable electrical field strength of the obscured live wire 401c. The housing 402 further comprises a handle 408 and a battery cover 410 and is in a shape that supports sensing pads arranged in a square pattern on a circuit board. Sensing pads that sense for obscured features may be in a non-linear configuration, such as within a square area, for improved uniform response of the group of sensing pads.

Figures 5, 6:
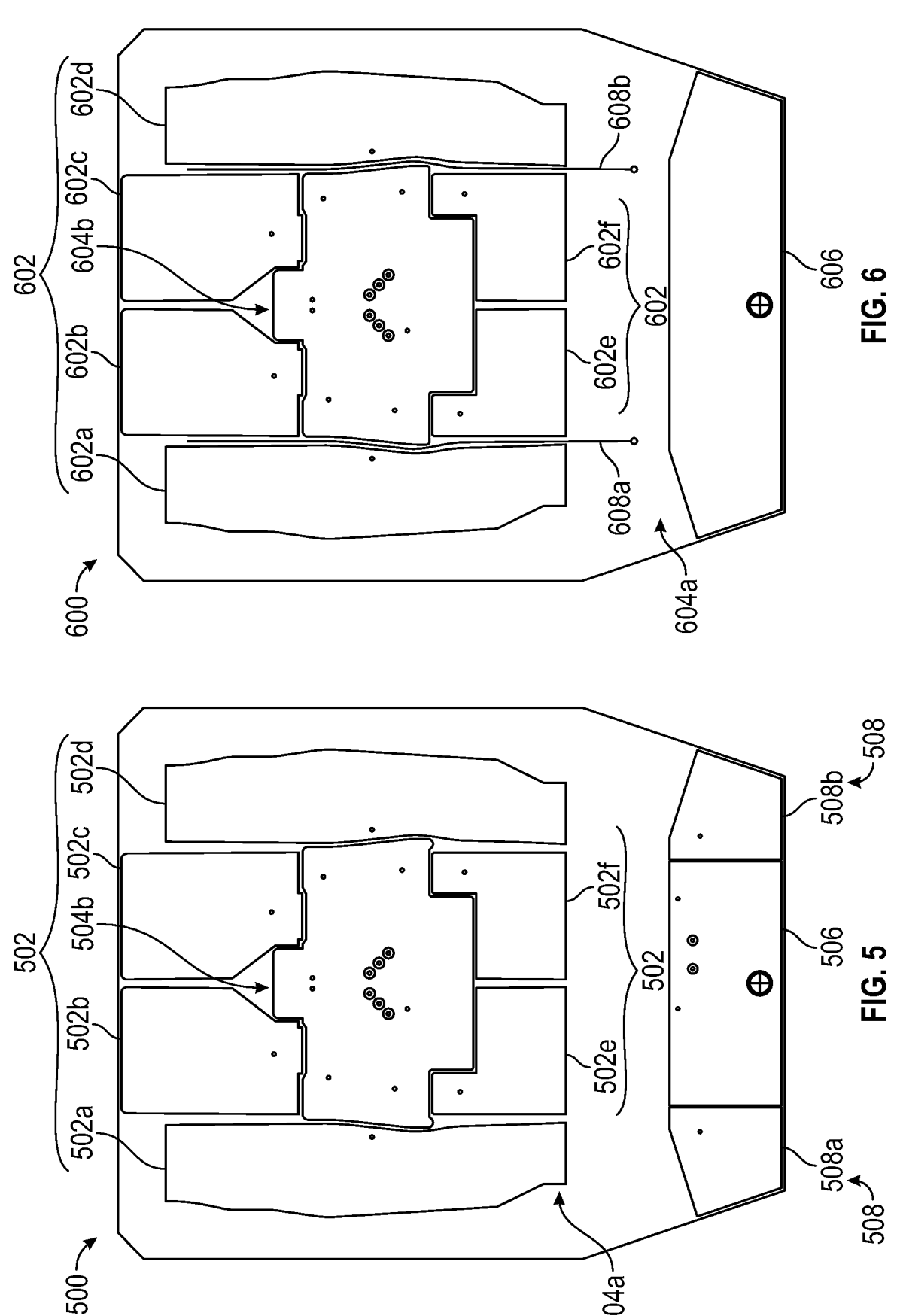
FIG. 5 shows the bottom layer of a circuit board of an obscured feature detector, according to another embodiment of the present disclosure.
FIG. 6 shows the bottom layer of a circuit board of an obscured feature detector, according to another embodiment of the present disclosure.

FIG. 5 is a view of a bottom of a circuit board 500 of an obscured feature detector, according to another embodiment of the present disclosure. The circuit board 500 may be integrated or otherwise included in an apparatus that detects obscured features and live wires, such as the apparatus 400 of FIG. 4. The circuit board 500 includes a sensing element 502 that comprises a plurality of sensing pads 502a-502f arranged in a square pattern, square-like pattern, or other symmetrical arrangement. The circuit board 500 may be multi-layered. Sensing pads 502e and 502f may be in the bottom layer of circuit board 500 or rather may be in a different layer of the circuit board 500. The circuit board 500 also includes a common plate 504, which can be an active shield plate driven as an active shield. The active shield plate 504a may not be on the bottom layer of the circuit board 500, but on a layer above the active shield plate 504b may also be on a different layer of the circuit board 500 instead of the bottom layer shown in FIG. 5 and positioned in a center of the sensing element 502 when viewed from the bottom of circuit board 500. The circuit board 500 further includes a ground plate 506 which may be connected to circuit ground and located between two live wire sensing elements 508 shown as live wire sensing pads 508a and 508b positioned near an end or adjacent to the sensing element 502 on the circuit board 500 in FIG. 5. The live wire sensing elements 508 are either coupled to a reference (such as active shield of ground) when obscured feature detection is occurring or may be left floating to sense the presence of live wires.

FIG. 6 is a view of a bottom of a circuit board 600 of an obscured feature detector, according to another embodiment of the present disclosure. The circuit board 600 may be integrated or otherwise included an apparatus that detects obscured features and live wires, such as apparatus 400. The circuit board 600 includes a sensing element 602 comprising a plurality of sensing pads 602a-602f. The sensing pads 602a-602f are arranged in a square pattern. The circuit board 600 further comprises a common plate which is an active shield plate driven as active shield and comprises active shield plates 604a and 604b. The active shield plate 604a may not be on the bottom layer of circuit board 600, but on a layer above. Active shield plate 604b may also be on a different layer of circuit board 600 and positioned in the center of sensing element 602 when viewed from the bottom of circuit board 600. The circuit board 600 further includes a ground plate 606 near an end or adjacent to the sensing element 602 on circuit board 600 and may be connected to circuit ground. For live wire sensing, circuit board 600 includes a live wire sensing element which comprises a live wire sensing rod, two of which are shown as live wire sensing rods 608a and 608b in FIG. 6. The live wire sensing rods 608a, 608b are coupled to a reference (such as the active shield of ground) when obscured feature detection is occurring or may be left floating to sense the presence of live wires.

FIG. 7 is a flow diagram of a sensing operation, according to an embodiment of the present disclosure. In this embodiment, a multiplexer (MUX) is used to couple 702 a live wire sensing element to either an electrical wire sensing circuitry or to a reference such as ground, an active shield, or another known reference signal. The sensing operation includes coupling a live wire sensing element to an electrical wire sensing circuitry using the MUX. An obscured live electrical wire is sensed 704 while the live wire sensing element is coupled to the electrical wire sensing circuitry. After completion of sensing live electrical wires, the MUX decouples 706 the live wire sensing element from electrical wire sensing circuitry and couples 708 the live wire sensing element to a reference such as ground or active shield. Location of an obscured feature is then sensed 710 with the live wire sensing element coupled to the reference. It may be advantageous to select a reference that is similar to its surroundings, for example, if the live wire sensing element is surrounded by ground, it may be advantageous to make the reference be ground. Such selection can make sensor pads have a more similar response and increase the ability to sense obscured features accurately. Once the sensing of obscured features has been completed, the MUX can be switched to decouple 712 the live wire sensing from the reference and back to coupling 702 the electrical wire sensing circuitry to the live wire sensing element. This interleaving of the live wire sensing element between the electrical wire sensing circuitry and a reference is repeated during operation to sense live electrical wires and obscured features.

Figure 8:
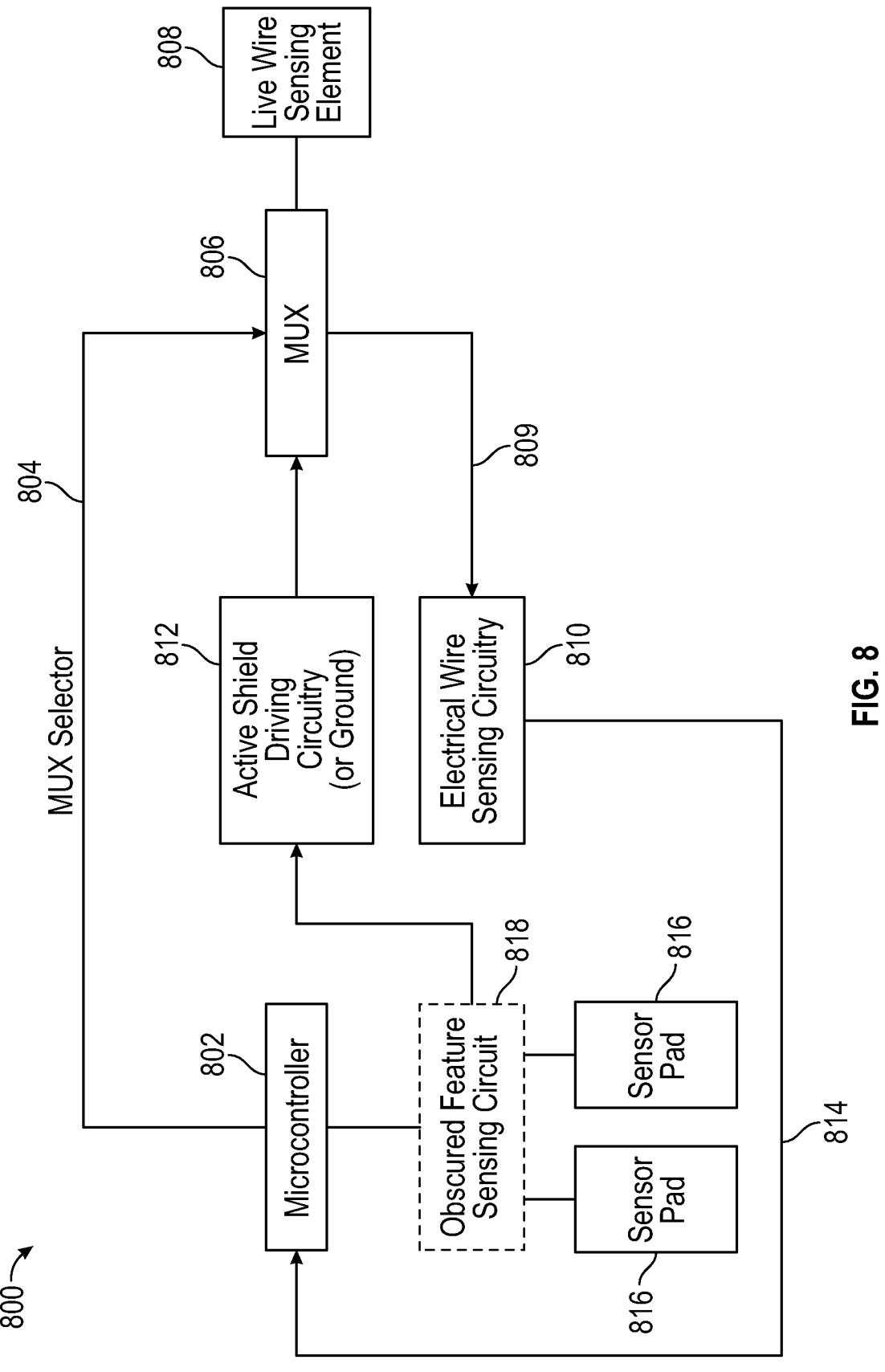
FIG. 8 is a block diagram of circuit, according to one embodiment of the present disclosure, that switches the live wire sensing elements between being connected to a reference, for obscured feature sensing, and being connected to sensing circuitry for sensing the presence of live wires.

FIG. 8 is a block diagram of a circuit 800 of an obscured feature detector that detects both obscured features and live wires, according to one embodiment of the present disclosure. The circuit 800 switches a live wire sensing element 808 between being connected to a reference for obscured feature sensing and being connected to sensing circuitry for sensing the presence of live wires. In this circuit 800, a microcontroller 802 provides a MUX Selector signal 804 to drive a MUX 806, which is to couple a live wire sensing element 808 to an electrical wire sensing circuitry 810. The MUX Selector signal 804 may be responsible for selecting if the live wire sensing element 808 is coupled to a reference, in this case an active shield driving circuitry 812 (or ground) or is coupled to the electrical wire sensing circuitry 810. A signal 809 is provided via the MUX to the electrical wire sensing circuitry 810. A signal 814 from the electrical wire sensing circuitry 810 is sent to the microcontroller 802. In one embodiment, the electrical wire sensing circuitry 810 in effect amplifies the signal 809, which is simply the MUX 806 passing the signal on the live wire sensing element 808.

The microcontroller 802 is also coupled with obscured feature sensing pads 816 via an obscured feature sensing circuit 818. The obscured feature sensing circuit 818 communicates with a reference circuitry, such as an active shield driving circuitry 812 or ground, which is connected to the MUX 806 that can couple the live wire sensing element 808 either to the electrical wire sensing circuitry 810 or the reference circuitry (e.g., the active shield driving circuitry 812).

In the diagram of FIG. 8, the wires (or lines) shown without arrows are bi-directional, while the wires (or lines) shown with only on arrow are unidirectional.

Figure 9:
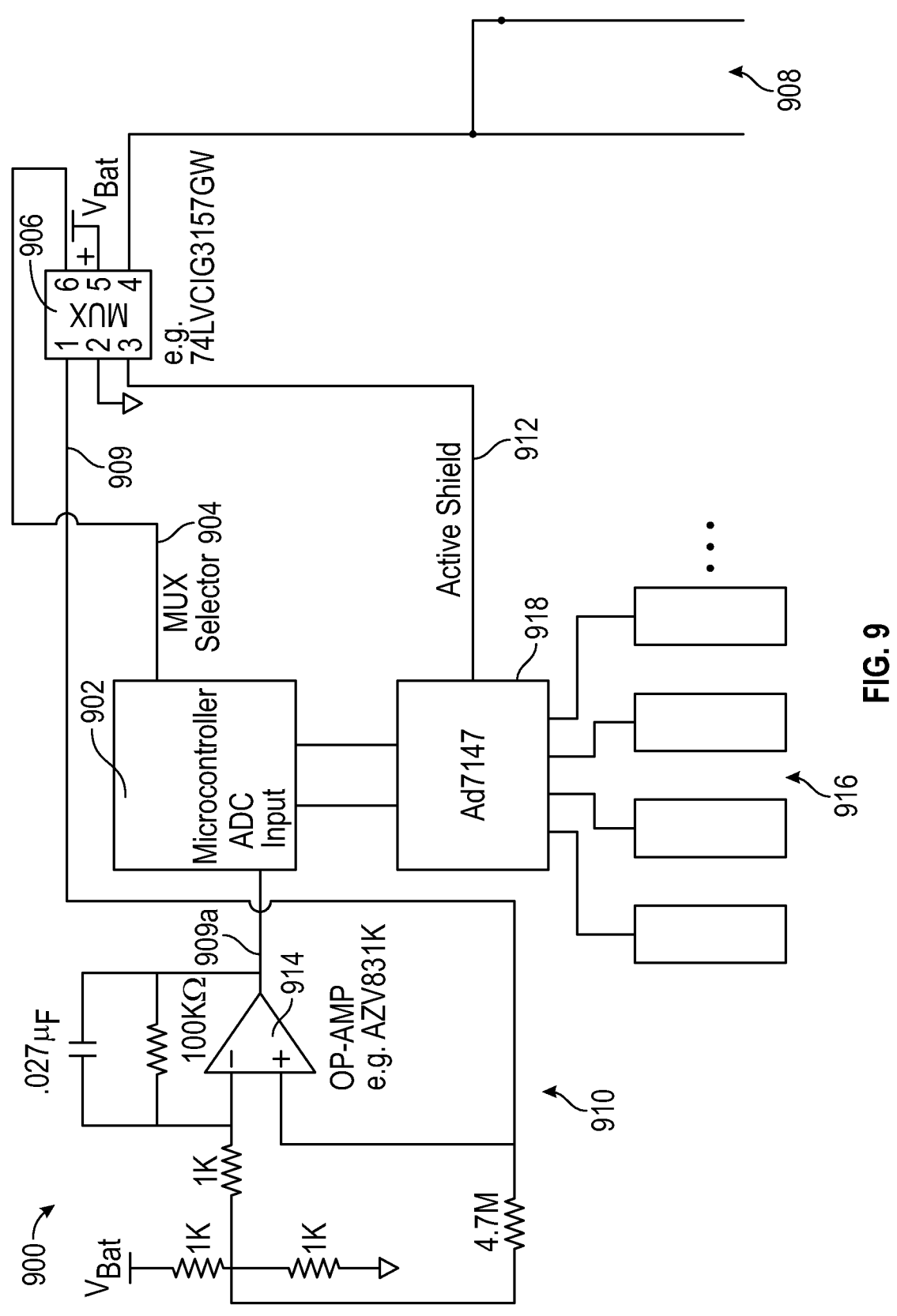
FIG. 9 is a more detailed diagram of the circuit of FIG. 8.

FIG. 9 is a more detailed circuit diagram of a circuit 900 of an obscured feature detector that switches a live wire sensing element 908 between being connected to a reference for obscured feature sensing and being connected to sensing circuitry for sensing the presence of live wires, according to one embodiment of the present disclosure. For example, the circuit 900 could be identical or similar to the circuit 800 of FIG. 8.

A microcontroller 902 drives a MUX selector signal 904, which is digital output provided to a MUX 906 that can couple a live wire sensing element 908 either to electrical wire sensing circuitry 910 or a reference such as ground or active shield 912 (sometimes also hereinafter referred to as active shield driving circuitry 912). An example of a micro-controller is a STM32G3157GW.

The MUX 906 can have six ports, ports 1-6. The live wire sensing element 908 may be one or more live wire sensing rods or live wire sensing pads connected to the MUX 906, for example to port 4 of the MUX 906. An example of a MUX 906 is a 74LVCIG3157GW.

The microcontroller 902 is fed an amplified signal 909*a*, which is an amplified form of the signal 909 from the live wire sensing element 908, as amplified by an operational amplifier (op-amp) 914. The op-amp 914 and associated resistors and capacitors can function as an amplifier. For example, a signal 909 from the MUX 906 can be provided through MUX port 1 to op-amp 914, which produces the amplified signal 909*a* that is passed on to the microcontroller 902. An example of an op-amp 914 is a AZV831K.

The microcontroller 902 can convert the signal from the live wire sensing element 908 to a digital signal via an analog to digital converter (ADC). The electrical wire sensing circuitry may comprise an analog to digital converter.

The microcontroller 902 is also connected to obscured feature sensing element 916 via obscured feature sensing circuitry 918. An example of the obscured feature sensing circuitry 918 shown in FIG. 9 is a AD7147. There may be numerous obscured feature sensing pads as an obscured feature sensing element 916. The obscured feature sensing circuitry 918 is linked to active shield driving circuitry 912 then to the MUX 906, for example to MUX port 3. Another example of an obscured feature sensing circuit 918 is AD7147PAC PZ-RL. In FIG. 9, the AD7147 obscured feature sensing circuitry 918 performs the obscured feature sensing and communicates directly with the microcontroller 902. The remaining MUX ports 5 and 2 may be used to supply battery voltage and common ground, respectively. Additional elements not shown in FIG. 9 and/or otherwise omitted from this discussion can include powers and grounds, display circuitry, and other signals as these are already known in the art or otherwise understood by one skilled in the art.

Figure 10:
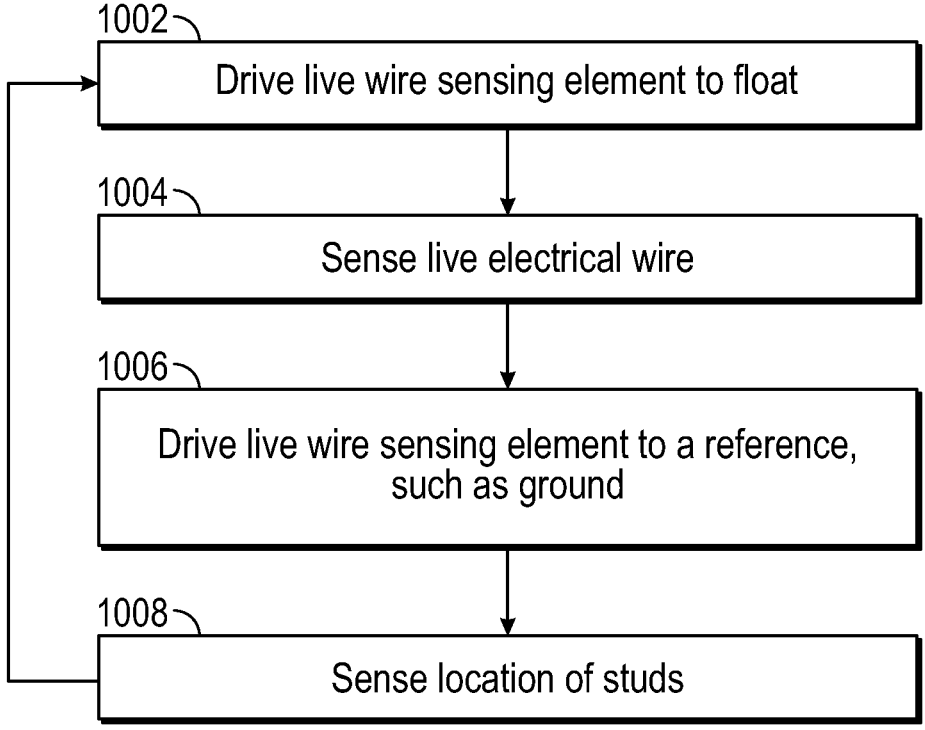
FIG. 10 is a flowchart that illustrates a flow of the sensing operation, according to one embodiment of the present disclosure.

FIG. 10 is a flow diagram of a sensing operation, according to another embodiment of the present disclosure. In this embodiment, a live wire sensing element is driven 1002 to float. An obscured live electrical wire is sensed 1004 while the live wire sensing element is floating. After the obscured live electrical wire is sensed 1004, the live wire sensing element is driven 1006 to a reference such as ground. Location of an obscured feature is then sensed 1008 with the live wire sensing element coupled to the reference. After completion of the sensing 1008 of obscured features, the live wire sensing element may again be driven 1002 to a floating state. This alternating of the live wire sensing element being driven alternately between a floating state and a reference is repeated to sense 1004 live electrical wires and to sense 1008 obscured features during sensing operation. A live wire sensing element may be driven 1002, 1006 by a controller, such as a microcontroller. A controller may be configured to intermittently drive the electrical wire sensing element to a driven value. For example, the live wire sensing element may be intermittently driven to a ground reference value, driven as an active shield, or driven to a value that matches the value on the sensor pads.

Figure 11:
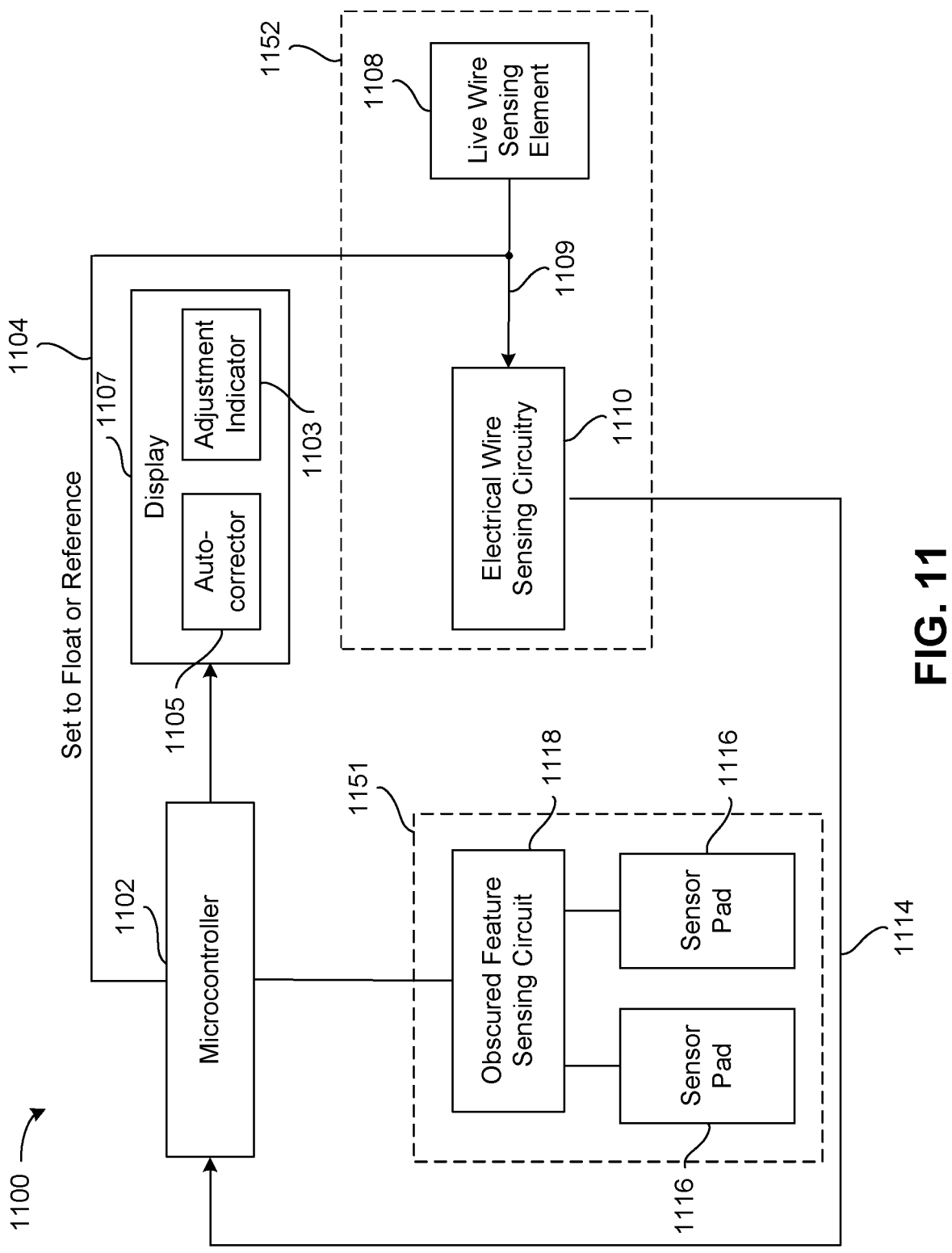
FIG. 11 is a block diagram of circuit, according to one embodiment of the present disclosure, that switches the live wire sensing elements between being connected to a reference, for obscured feature sensing, and being connected to sensing circuitry for sensing the presence of live wires.

FIG. 11 is a block diagram of a circuit 1100 of an obscured feature detector that detects both obscured features and live wires, according to one embodiment of the present disclosure. The circuit 1100 of FIG. 11 includes both obscured feature detection circuitry 1151 (e.g., an obscured feature detection component that may include obscured feature sensing circuitry 1118 and one or more sensing pads 1116) and live wire detection circuitry 1152 (e.g., a live wire detection component that may include a live wire sensing element 1108 and electrical wire sensing circuitry 1110). The circuit 1100 switches a live wire sensing element 1108 between a state of floating (for sensing the presence of live wires) and a state of being connected to a reference (for sensing obscured features). A microcontroller 1102 is included in the circuit 1100 which provides an output signal 1104 to drive the live wire sensing element 1108 either to float or to a reference. The wire sensing element 1108 also is connected to live wire sensing circuitry 1110. In a floating state of the live wire sensing element 1108, a signal 1109 is provided to the electrical wire sensing circuitry 1110. A signal 1114 from electrical wire sensing circuitry 1110 is sent to the microcontroller 1102. In one embodiment, the electrical wire sensing circuitry 1110 in effect amplifies the signal 1109. When the live wire sensing element 1108 is driven to a reference, such as ground, the signal 1114 is sent to microcontroller 1102 to in effect couple with and otherwise activate reading the obscured feature sensing pads 1116 via an obscured feature sensing circuit 1118.

In some embodiments, the circuit 1100 includes a display 1107 (e.g., a live wire indicator display, an obscured feature indicator display, a combination thereof). The display 1107 can be and/or include the live wire indicator display 106 of FIG. 1. The display 1107 is configured to present (e.g., to a user) visual indicia of a variable electrical field strength of a detected live electrical wire (e.g., readings of the electrical wire sensing circuitry 1110). The visual indicia may be varied or changed to present the variability of the electrical field strength of the detected live wire. The display 1107 may include one or more visual indicators, such as one or more illuminating elements (e.g., a light, LED). In some embodiments, the display 1107 can receive an input from the microcontroller 1102. In some embodiments, the display 1107 can be an output of the microcontroller 1102. In some embodiments, the display 1107 can be coupled to the microcontroller 1102.

In some embodiments, the range of the display 1107 is fixed. In other words, the range of the display 1107 is set to permanent values at the factory.

In some embodiments the display 1107 includes an auto-corrector 1105 that can automatically adjust the range (e.g., the scale) of the display 1107. The auto-corrector 1105 can adjust the range of the display 1107 by re-scaling and/or shifting the range (e.g., scale) of the display 1107. The auto-corrector 1105 may be used to adjust the range of the display 1107 (or display range) in the event that a new electrical strength reading (e.g., a reading of the electrical wire sensing circuitry 1110) would otherwise map to a location beyond the range of the display 1107. In other words, if a new electrical strength reading were to be a value that was beyond the range (or scale) of the display 1107, then the auto-corrector 1105 would adjust the range of the display 1107, so that the new reading (e.g., the new reading of the electrical wire sensing circuitry 1110) would then be within the range of the display 1107.

In some embodiments, the auto-corrector 1105 will adjust the range (e.g., scale) of the display 1107 each time a reading is beyond the range of the display 1107. In some embodiments the auto-corrector 1105 will only adjust the range of the display 1107 if an electrical strength reading (e.g., a reading of the electrical wire sensing circuitry 1110) is beyond the range of the display 1107 by a predetermined margin. For example, if the range of the display 1107 presently has a maximum range of one hundred counts, and a new reading has value of one hundred and ten counts then the auto-corrector 1105 would adjust the range of the display 1107 such that the new maximum range of the display 1107 becomes one hundred and ten counts. In some embodiments, the auto-corrector 1105 adjusts the range of the display 1107 to be larger than the new reading (e.g., the new reading of the electrical wire sensing circuitry 1110, such as, for example one hundred and twenty counts, or two hundred counts). In some embodiments, the auto-corrector 1105 will adjust the range of the display 1107 after a predetermined number of readings within a predetermined period of time are beyond the range of the display 1107. In some embodiments, each time the auto-corrector 1105 adjusts the range of the display 1107, it will automatically over-adjust, to possibly mitigate the need for future adjustments. In some embodiments, each time the auto-corrector 1105 adjusts the range of the display 1107 it may automatically under-adjust by what may be a small margin, in anticipation that under-adjusting may make the range of the display 1107 more suitable to the user. In some embodiments, each time the auto-corrector 1105 makes an adjustment to the range of the display 1107, an algorithm will determine the magnitude of any over-adjustment, or under-adjustment, depending one or more relevant factors.

In some embodiments, the auto-corrector 1105 can adjust the range of the display 1107 in the event that new readings would otherwise map to a range of the display 1107 that makes it difficult for a user to discern because of how weak the signal is. The auto-corrector 1105 can adjust the range of the display 1107 by shifting and/or rescaling the range of the display 1107. In other words, if a series of new electrical strength readings were to be consistently (e.g., for a predetermined period of time) beneath a predetermined threshold of the display 1107, then the auto-corrector 1105 would adjust the range of the display 1107 so that the new readings would then be more discernibly within the range of the display 1107.

In some embodiments, each instance that a predetermined number of readings of the electrical wire sensing circuitry 1110 (e.g., electrical strength readings) are below a predetermined threshold within a predetermined period of time, the auto-corrector 1105 makes an adjustment to the range of the display 1107. For example, the auto-corrector 1105 may adjust the range of the display 1107 to be half the original range if five consecutive readings of the electrical wire sensing circuitry 1110 are received that are all less than 20% of the range of the display 1107, thereby doubling granularity of the scale of the display 1107. For another example, the auto-corrector 1105 may adjust the range of the display 1107 to be 40% the original range of the display 1107 if four out of the most recent five readings of the electrical wire sensing circuitry 1110 are all less than 15% of the range of the display 1107.

In some embodiments, the auto-corrector 1105 can adjust the range of the display 1107 responsive to a new reading that is beneath the range of the display 1107. For example, if a reading of the electrical wire circuitry 1110 is less than the range of the display 1107, such that no illuminating elements of the display 1107 are lit, the auto-corrector 1105 can adjust the range of the display 1107 such that the range of the display 1107 includes the reading from the electrical wire circuitry. In some embodiments, the auto-corrector 1105 can adjust the range of the display 1107 responsive to the electrical wire sensing circuitry 1110 amplifying the signal 1109.

In some embodiments the display 1107 can include an adjustment indicator 1103 to indicate when the range of the display 1107 has been adjusted by the auto-corrector 1105. The adjustment indicator 1103 can provide an indication of the strength of electrical field indicated by the range of the display 1107. In some embodiments, the adjustment indicator 1103 provides a first indication responsive to an increase of the range of the display 1107 by the auto-corrector 1105. In some embodiments, the adjustment indicator 1103 provides a second indication responsive to a decrease of the range of the display 1107 by the auto-corrector 1105. The indication provided by the adjustment indicator 1103 can be a numeric range corresponding to the range of the display 1107. The indication provided by the adjustment indicator 1103 can be an illuminating element (e.g., a red light to indicate that the auto-corrector 1105 has increased the range of the display 1107, or a green light to indicate that the auto-corrector 1105 has decreased the range of the display 1107).

Figure 12:
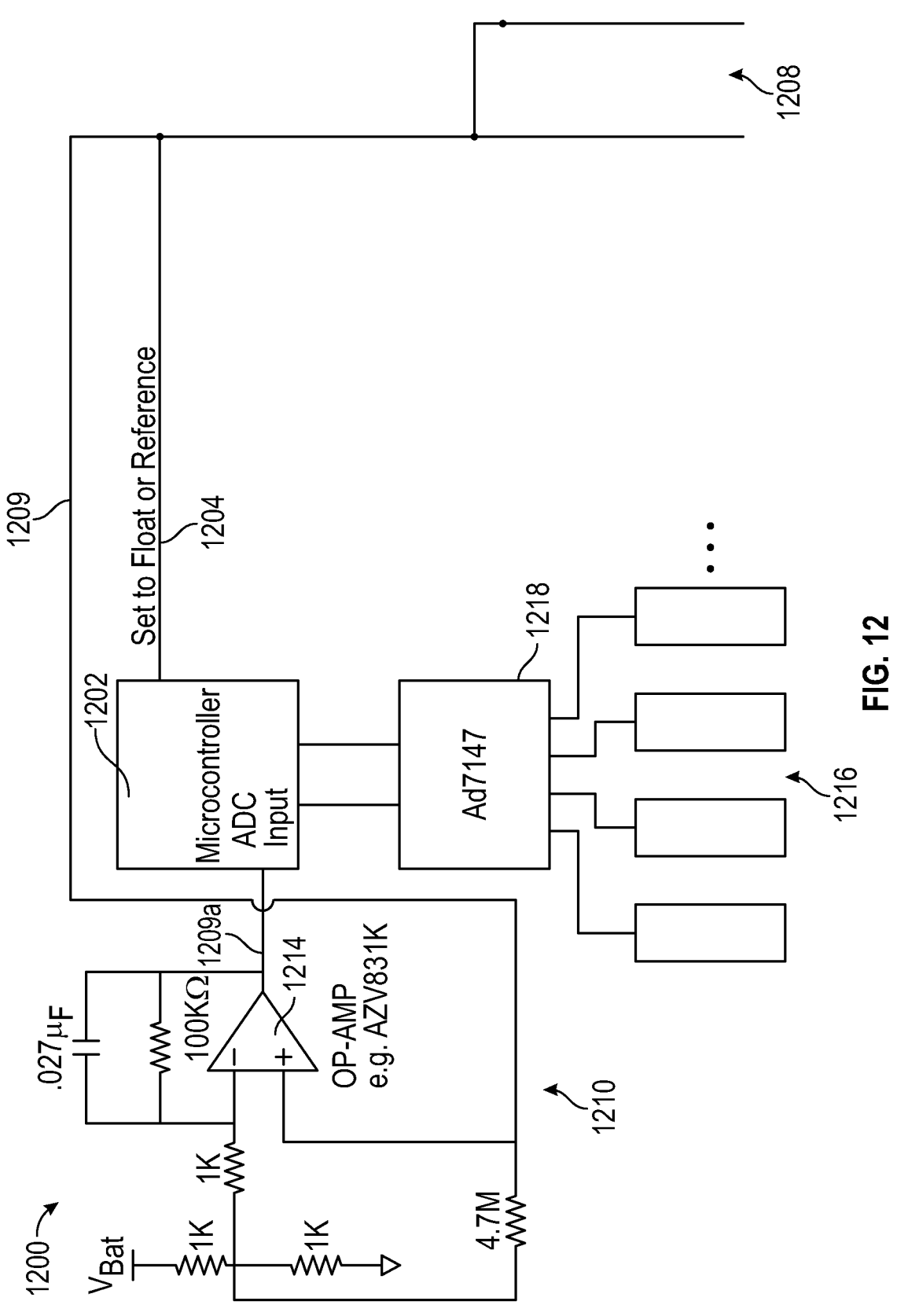
FIG. 12 is a more detailed diagram of the circuit of FIG. 11.

FIG. 12 is a more detailed circuit diagram of a circuit 1200 of an obscured feature detector that switches a live wire sensing element 1208 between being connected to a reference for obscured feature sensing and being connected to sensing circuitry for sensing the presence of live wires, according to one embodiment of the present disclosure. For example, the circuit 1200 could be identical or similar to the circuit 1100 of FIG. 11. The live wire sensing element 1208 may comprise at least a portion of a common plate, such as an active shield plate described above with reference to FIGS. 2-6.

A microcontroller 1202 drives a signal 1204 that can couple a live wire sensing element 1208 to electrical wire sensing circuitry 1210. An example of a microcontroller is a STM32G3157GW. The signal 1204 is set to float or to a reference.

The microcontroller 1202 is fed an amplified signal 1209*a* that is an amplified form of a signal 1209 from the live wire sensing element 1208, as amplified by an operational amplifier (op-amp) 1214. The op-amp and associated resistors and capacitors can function as an amplifier. For example, a signal 1209 to op-amp 1214, which produces the amplified signal 1209*a*, is passed on to the microcontroller 1202. An example of an op-amp 1214 is a AZV831K.

The electrical wire sensing circuitry 1210 may comprise an analog to digital converter. It may be that the microcontroller 1202 can convert the signal from the live wire sensing element 1208 to a digital signal via an analog to digital converter (ADC).

The microcontroller 1202 is also connected to an obscured feature sensing element 1216 via obscured feature sensing circuitry 1218. An example of the obscured feature sensing circuitry 1218 shown in FIG. 12 is a AD7147. There may be numerous obscured feature sensing pads as an obscured feature sensing element 1216. Another example of an obscured feature sensing circuit 1218 is AD7147PAC PZ-RL. In FIG. 12, the AD7147 obscured feature sensing circuitry 1218 performs the obscured feature sensing and communicates directly with the microcontroller 1202. Additional elements not shown in FIG. 12 and/or otherwise omitted from this discussion can include powers and grounds, display circuitry, and other signals as these are already known in the art or otherwise understood by one skilled in the art.

Figures 13A, 13B:
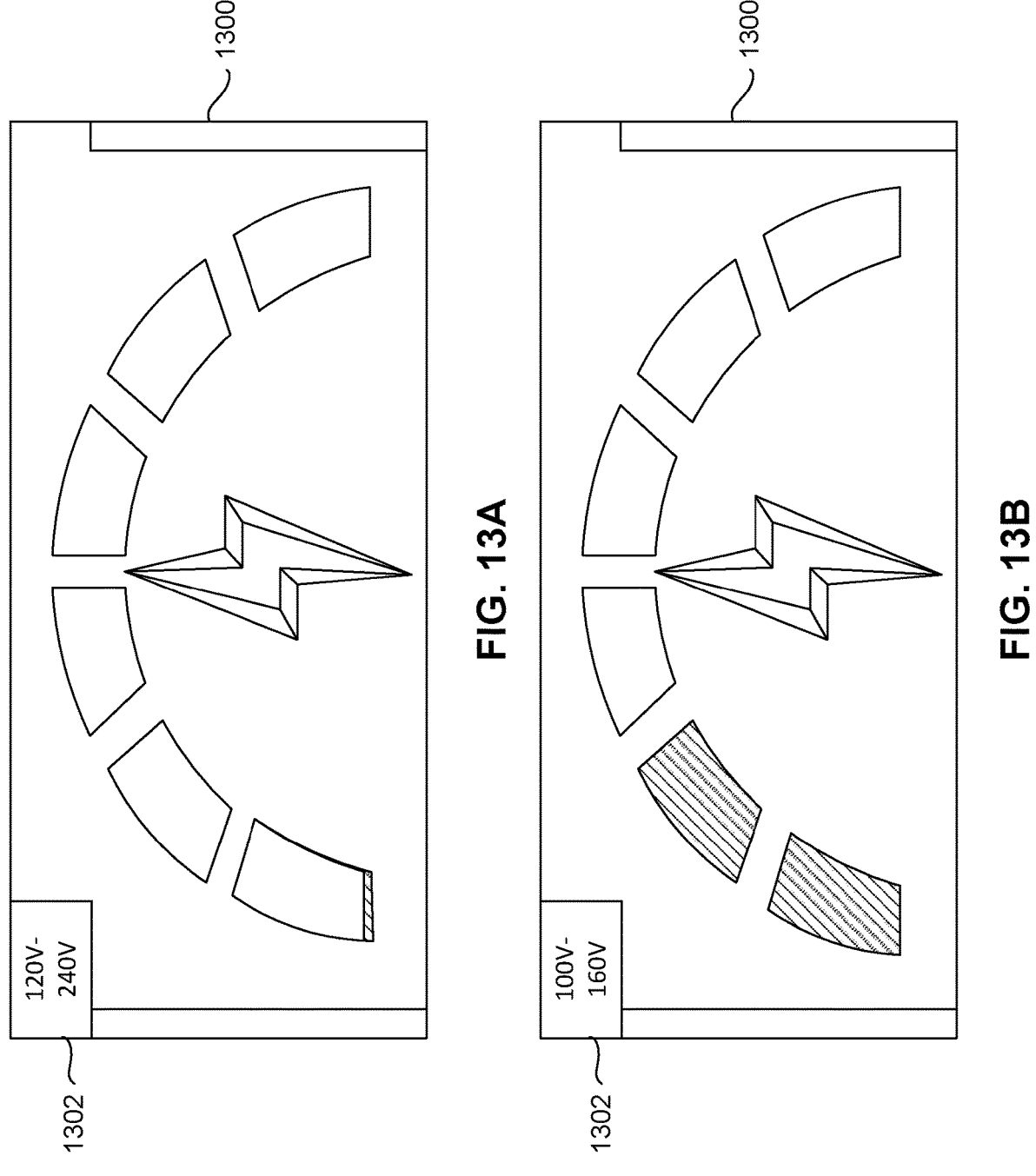
FIGS. 13A, 13B, 14A, and 14B are example embodiments of a live wire indicator display.

FIGS. 13A and 13B are illustrative examples of a live wire indicator display 1300 (sometimes hereinafter referred to as a display 1300). The display 1300 can be similar to and/or include the live wire indicator display 106 of FIG. 1. The display 1300 is configured to present (e.g., to a user) visual indicia of variable electrical field strength of a detected live electrical wire, such as, for example, readings of the electrical wire sensing circuitry 1110 of FIG. 11. The visual indicia may be varied or changed to present the variability of the electrical field strength of the detected live wire. The display 1300 may include one or more visual indicators, such as one or more illuminating elements (e.g., a light, LED). There can be a correlation between the amount of illuminating elements of the display 1300 that are lit up and the strength of the electrical field detected by the electrical wire sensing circuitry (e.g., fewer illuminating elements lit up can be indicative of a weaker signal, or more illuminating elements lit up can be indicative of a stronger signal).

The display 1300 can include a range indicator 1302. The range indicator 1302 can display a range of values (e.g., a scale) that corresponds to the range of the display 1300. The values of the range indicator 1302 can include numerical values and/or units of measurement. In the event of a reading (e.g., a reading of electrical wire sensing circuitry) that is difficult to discern because it is on a lower end of the range of the display 1300, the range indicator 1302 can decrease the range of values present on the display 1300 and scale the display 1300 accordingly, such that the scaling of the display 1300 increases the granularity of the display 1300, thereby enabling for a user to determine, perceive or otherwise understand the strength of the reading with more accuracy. In some embodiments, the range indicator 1302 can couple to or include an auto-corrector as described previously.

For example, FIG. 13A illustrates a display 1300 with six illuminating elements. A small portion of the leftmost illuminating element is lit. The range indicator 1302 displays "120V-240V." Together, the display 1300 and the range indicator 1302 present information that the range currently represented by the display is 120V-240V, and that the electrical wire sensing circuitry is detecting an electrical field with voltages (e.g., a metric of electrical field strength) on the lower side of the 120V-240V range (e.g., relatively weaker electrical field readings).

Responsive to the detection of the electrical field readings, the range indicator 1302 decreases the range of the display 1300 and scales the display 1300 correspondingly. The range indicator 1302 can decrease the range of the display 1300 by shifting and/or rescaling the range of the display 1300.

FIG. 13B illustrates an adjusted (e.g., shrunk) range of the display 1300. Two of the six illuminating elements of the display 1300 are illuminated. The range indicator 1302 displays "100V-160V." Together, the information from the display 1300 and the range indicator 1302 allow a user to determine that the scale of the display is 100V-160V, and that the strength of the electrical field detected by the electrical wire sensing circuitry is approximately ⅓ of that range.

Together, FIG. 13A and FIG. 13B illustrate an embodiment of the functionality of the display 1300 and the range indicator 1302. The range indicator 1302 can decrease (e.g., adjust) the range of the display 1300 such that weak signals can be displayed with increased granularity. The range indicator 1302 can shift the range of the display 1300. The range indicator 1302 can rescale the range of the display 1302. In FIG. 13A, the range indicator 1302 reads "120V-240V," whereas in FIG. 13B, the range indicator 1302 reads "100V-160V." This change indicates that the range indicator 1302 has shifted the range of the display 1300, from 120V-240V to 100V-160V. This change also indicates that the range indicator 1302 has rescaled the range of the display 1300, because in FIG. 13A the six illuminating elements correlate to a range of 120V (e.g., the difference between the higher end, 240V, and the lower end, 120V, indicated by the range indicator 1302), whereas in FIG. 13B the six illuminating elements correlate to a range of 60V (e.g., the difference between the higher end, 160V, and the lower end, 100V, of the range indicator 1302.

Figures 14A, 14B:
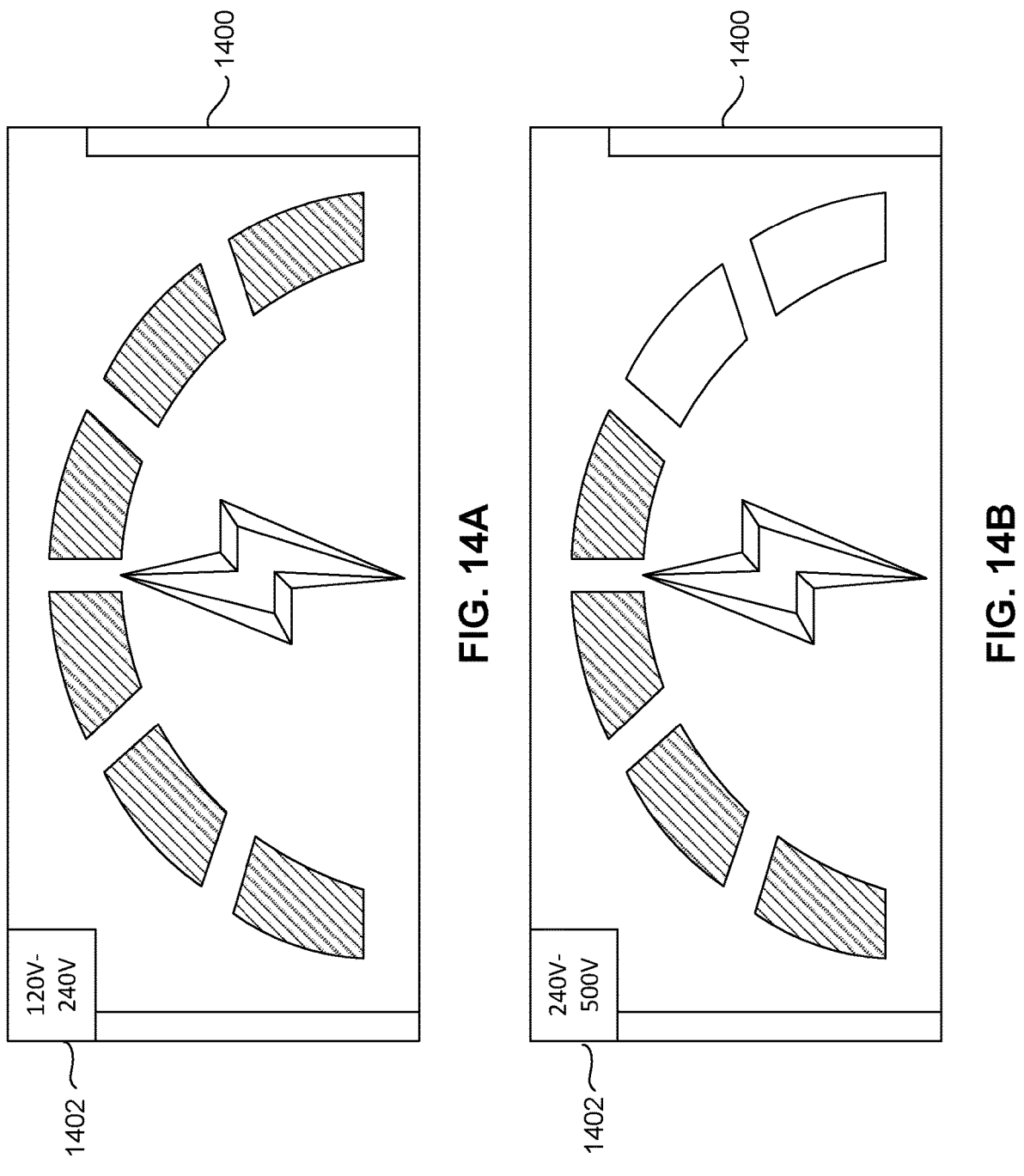

FIGS. 14A and 14B are illustrative examples of a live wire indicator display 1400 (sometimes hereinafter referred to as a display 1400). The display 1400 can include or be similar to the live wire indicator display 106 of FIG. 1. The display 1400 is configured to present (e.g., to a user) visual indicia of variable electrical field strength of a detected live electrical wire, such as, for example, readings of the electrical wire sensing circuitry 1110 of FIG. 11. The visual indicia may be varied or changed to present the variability of the electrical field strength of the detected live wire. The display 1400 may include one or more visual indicators, such as one or more illuminating elements (e.g., a light, LED). There can be a correlation between the amount of illuminating elements of the display 1400 that are lit up and the strength of the electrical field detected by the electrical wire sensing circuitry (e.g., fewer elements lit up can be indicative of a weaker signal, or more illuminating elements lit up can be indicative of a stronger signal).

The display 1400 can include a range indicator 1402. The range indicator 1402 can display a range of values (e.g., a scale) that corresponds to the range of the display 1400. The values of the range indicator 1402 can include numerical values and/or units of measurement. In the event of an electrical reading of sufficient magnitude that all of the illuminating elements of the display 1400 are lit (e.g., a reading of the electrical wire sensing circuitry on an upper end of the values of the range indicator 1402), the range indicator 1402 can increase the range of values present on the display 1400. In other words, when an electrical strength reading would otherwise map to a location beyond the range of the display 1400, the range indicator 1402 can adjust the range of the display 1400 such that the electrical strength reading no longer maps to a location beyond the range of the display 1400.

For example, FIG. 14A illustrates a display 1400 with six illuminating elements. All six illuminating elements are lit. The range indicator 1402 displays "120V-240V. Together, the display 1400 and the range indicator 1402 present information that the range currently represented by the display is 120V-240V, and that the electrical wire sensing circuitry is detecting an electrical field with voltages (e.g., a metric of electrical field strength) on the upper side of the 120V-240V range (e.g., relatively stronger electrical field readings).

Responsive to the detection of the electrical field readings, the range indicator 1402 increases the range of the display 1400 and scales the display 1400 correspondingly. In some embodiments the range indicator 1402 can couple to or include an auto-corrector as described previously.

FIG. 14B illustrates an adjusted (e.g., expanded) range of the display 1400. Four of the six illuminating elements of the display 1400 are illuminated. The range indicator 1402 displays "240V-500V." Together, the information from the display 1400 and the range indicator 1402 allow a user to determine, perceive, or otherwise understand that the scale (e.g., range) of the display is 240V-500V, and that the strength of the electrical field detected by the electrical wire sensing circuitry is approximately ⅔ of that range. In some embodiments, the range indicator 1402 can rescale the display 1400 to provide improved granularity of the display 1400.

Together, FIG. 14A and FIG. 14B illustrate an embodiment of the functionality of the display 1400 and the range indicator 1402. The range indicator 1402 can increase (e.g., adjust) the range of the display 1400 such that strong signals can be displayed with a range that quantifies the number of lit up illuminating elements. The range indicator 1402 can shift and/or rescale the range of the display 1400.

Examples

The following provide one or more examples of embodiments of the present disclosure.

Example 1. An apparatus for detecting behind a surface, the apparatus comprising: an obscured feature sensing element to sense an obscured feature; obscured feature sensing circuitry operatively coupled to the obscured feature sensing element, the obscured feature sensing circuitry configured to measure a sensor reading on the obscured feature sensing element; an obscured feature indicator to display that an obscured feature is detected behind a surface, based on the sensor reading; a live wire sensing element to detect an obscured live electrical wire; electrical wire sensing circuitry operatively coupled to the live wire sensing element, the electrical wire sensing circuitry to receive signals originating from the live wire sensing element; a live wire indicator to display a variable electrical field strength of a detected live electrical wire, based on the signals originating from the live wire sensing element; and an auto-corrector to automatically adjust the display range of the live wire indicator, wherein the obscured feature indicator and the live wire indicator are concurrently displayed.

Example 2. The apparatus of example 1, wherein the live wire indicator displays a visual indicia that is variable based on the variable electrical field strength of the detected live electrical wire.

Example 3. The apparatus of example 1, wherein the live wire indicator comprises a plurality of display segments to incrementally display the variable electrical field strength of the detected live electrical wire according to the adjusted display range, wherein the plurality of display segments includes illuminating elements, which are to illuminate to display for a user to view the variable electrical field strength of the detected live wire and each segment of the plurality of display segments is indicative of a portion of the display range; wherein a larger number of illuminated illuminating elements indicate a stronger electrical field strength of the detected live electrical wire than a smaller number of illuminated illuminating elements.

Example 4. The apparatus of example 1, the live wire indicator comprising: an adjustment indicator to indicate the display range has been automatically adjusted by the auto-corrector.

Example 5. The apparatus of example 1, wherein the auto-corrector adjusts the display range based on a new reading below a threshold level of the display range of the live wire indicator to provide additional granularity on a display scale.

Example 6. The apparatus of example 5, wherein the auto-corrector adjusts the display range to extend twice the threshold level.

Example 7. The apparatus of example 1, wherein the auto-corrector adjusts the display range according to a plurality of threshold levels, wherein the auto-corrector adjusts the display to a first new display range according to a first new reading below a first threshold level of the plurality of threshold levels and adjusts the display to a second new display range according to a second new reading below a second threshold level of the plurality of threshold levels.

Example 8. The apparatus of example 1, wherein the auto-corrector adjusts the display range according to a plurality of threshold levels, wherein the auto-corrector adjusts the display to a first new display range according to a first new reading below a first threshold level of the plurality of threshold levels and an adjustment indicator indicates the auto-corrector adjusted the display to the first new display range.

Example 9. The apparatus of example 1, wherein the auto-corrector adjusts the display range in the event that a new reading is above the display range of the live wire indicator.

Example 10. The apparatus of example 1, wherein the obscured feature indicator comprises a plurality of illuminating elements that extend laterally along a length of the apparatus, wherein a corresponding one or more illuminating element of the plurality of illuminating elements illuminate when aligned with the obscured feature.

Example 11. The apparatus of example 10, wherein a larger number of illuminated illuminating elements indicate a stronger alignment of the plurality of illuminating elements with the obscured feature than a smaller number of illuminated illuminating elements.

Example 12. The apparatus of example 1, wherein the obscured feature indicator communicates a location of the obscured feature.

Example 13. An apparatus for detecting behind surfaces, the apparatus comprising: an obscured feature indicator to display that an obscured feature is detected behind a surface; a live wire indicator to display a variable electrical field strength of an obscured live electrical wire, wherein the live wire indicator has a display range; and an auto-corrector to adjust the display range of the live wire indicator, wherein the obscured feature indicator and the live wire indicator are concurrently displayed for a user to view.

Example 14. The apparatus of example 13, wherein the live wire indicator displays a visual indicia that varies based on the electrical field strength of the detected live electrical wire.

Example 15. The apparatus of example 13, wherein the live wire indicator comprises a plurality of display segments that are incrementally actuatable to display to the user the electrical field strength of the detected live electrical wire.

Example 16. The apparatus of example 15, wherein the plurality of display segments includes illuminating elements that illuminate to display to the user the electrical field strength of the detected live electrical wire.

Example 17. The apparatus of example 16, wherein a larger number of illuminated illuminating elements indicate a stronger electrical field strength of the detected live electrical wire than a smaller number of illuminated illuminating elements.

Example 18. The apparatus of example 13, the live wire indicator comprising: an adjustment indicator to indicate the display range has been automatically adjusted by the auto-corrector.

Example 19. The apparatus of example 13, wherein the auto-corrector adjusts the display range according to a plurality of threshold levels, wherein the auto-corrector adjusts the display to a first new display range according to a first new reading below a first threshold level of the plurality of threshold levels and adjusts the display to a second new display range according to a second new reading below a second threshold level of the plurality of threshold levels.

It will be obvious to those having skill in the art that many changes may be made to the details of the above-described embodiments without departing from the underlying principles of the invention. The scope of the present invention should, therefore, be determined only by the following claims.

What is claimed is:

1. An apparatus for detecting behind a surface, the apparatus comprising:

an obscured feature sensing element to sense an obscured feature;

obscured feature sensing circuitry operatively coupled to the obscured feature sensing element, the obscured feature sensing circuitry configured to measure a sensor reading on the obscured feature sensing element;

an obscured feature indicator to display that an obscured feature is detected behind a surface, based on the sensor reading;

a live wire sensing element to detect an obscured live electrical wire;

electrical wire sensing circuitry operatively coupled to the live wire sensing element, the electrical wire sensing circuitry to receive signals originating from the live wire sensing element;

a live wire indicator to display a variable electrical field strength of a detected live electrical wire, based on the signals originating from the live wire sensing element; and an auto-corrector to automatically adjust a display range of the live wire indicator, wherein the obscured feature indicator and the live wire indicator are concurrently displayed.

2. The apparatus of claim 1, wherein the live wire indicator displays a visual indicia that is variable based on the variable electrical field strength of the detected live electrical wire.

3. The apparatus of claim 1, wherein the live wire indicator comprises a plurality of display segments to incrementally display the variable electrical field strength of the detected live electrical wire according to the adjusted display range, wherein the plurality of display segments includes illuminating elements, which are to illuminate to display for a user to view the variable electrical field strength of the detected live wire and each segment of the plurality of display segments is indicative of a portion of the display range;

wherein a larger number of illuminated illuminating elements indicate a stronger electrical field strength of the detected live electrical wire than a smaller number of illuminated illuminating elements.

4. The apparatus of claim 1, the live wire indicator comprising:

an adjustment indicator to indicate the display range has been automatically adjusted by the auto-corrector.

5. The apparatus of claim 1, wherein the auto-corrector adjusts the display range based on a new reading below a threshold level of the display range of the live wire indicator to provide additional granularity on a display scale.

6. The apparatus of claim 5, wherein the auto-corrector adjusts the display range to extend twice the threshold level.

7. The apparatus of claim 1, wherein the auto-corrector adjusts the display range according to a plurality of threshold levels, wherein the auto-corrector adjusts the display range to a first new display range according to a first new reading below a first threshold level of the plurality of threshold levels and adjusts the display range to a second new display range according to a second new reading below a second threshold level of the plurality of threshold levels.

8. The apparatus of claim 1, wherein the auto-corrector adjusts the display range according to a plurality of threshold levels, wherein the auto-corrector adjusts the display range to a first new display range according to a first new reading below a first threshold level of the plurality of threshold levels and an adjustment indicator indicates the auto-corrector adjusted the display to the first new display range.

9. The apparatus of claim 1, wherein the auto-corrector adjusts the display range in the event that a new reading is above the display range of the live wire indicator.

10. The apparatus of claim 1, wherein the obscured feature indicator comprises a plurality of illuminating elements that extend laterally along a length of the apparatus, wherein a corresponding one or more illuminating element of the plurality of illuminating elements illuminate when aligned with the obscured feature.

11. The apparatus of claim 10, wherein a larger number of illuminated illuminating elements indicate a stronger alignment of the plurality of illuminating elements with the obscured feature than a smaller number of illuminated illuminating elements.

12. The apparatus of claim 1, wherein the obscured feature indicator communicates a location of the obscured feature.

13. An apparatus for detecting behind surfaces, the apparatus comprising:

an obscured feature indicator to display that an obscured feature is detected behind a surface;

a live wire indicator to display a variable electrical field strength of an obscured live electrical wire, wherein the live wire indicator has a display range; and an auto-corrector to adjust the display range of the live wire indicator, wherein the obscured feature indicator and the live wire indicator are concurrently displayed for a user to view.

14. The apparatus of claim 13, wherein the live wire indicator displays a visual indicia that varies based on the variable electrical field strength of the detected live electrical wire.

15. The apparatus of claim 13, wherein the live wire indicator comprises a plurality of display segments that are incrementally actuatable to display to the user the variable electrical field strength of the detected live electrical wire.

16. The apparatus of claim 15, wherein the plurality of display segments includes illuminating elements that illuminate to display to the user the variable electrical field strength of the detected live electrical wire.

17. The apparatus of claim 16, wherein a larger number of illuminated illuminating elements indicate a stronger electrical field strength of the detected live electrical wire than a smaller number of illuminated illuminating elements.

18. The apparatus of claim 13, the live wire indicator comprising:

an adjustment indicator to indicate the display range has been automatically adjusted by the auto-corrector.

19. The apparatus of claim 13, wherein the auto-corrector adjusts the display range according to a plurality of threshold levels, wherein the auto-corrector adjusts the display range to a first new display range according to a first new reading below a first threshold level of the plurality of threshold levels and adjusts the display range to a second new display range according to a second new reading below a second threshold level of the plurality of threshold levels.

* * * * *